(12) United States Patent
Cornett et al.

(10) Patent No.: US 9,960,336 B2
(45) Date of Patent: May 1, 2018

(54) WAFER SCALE THERMOELECTRIC ENERGY HARVESTER HAVING TRENCHES FOR CAPTURE OF EUTECTIC MATERIAL

(71) Applicant: Analog Devices, Inc., Norwood, MA (US)

(72) Inventors: Jane Cornett, Wilmington, MA (US); Baoxing Chen, Westford, MA (US); William Allan Lane, Waterfall (IE); Patrick M. McGuinness, Pallaskenry (IE); Helen Berney, Pennywell (IE)

(73) Assignee: Analog Devices, Inc., Norwood, MA (US)

( * ) Notice: Subject to any disclaimer, the term of this patent is extended or adjusted under 35 U.S.C. 154(b) by 208 days.

(21) Appl. No.: 14/936,510

(22) Filed: Nov. 9, 2015

(65) Prior Publication Data
US 2016/0064637 A1 Mar. 3, 2016

Related U.S. Application Data

(63) Continuation-in-part of application No. 14/274,590, filed on May 9, 2014, now Pat. No. 9,748,466, which
(Continued)

(51) Int. Cl.
*H01L 35/04* (2006.01)
*H01L 35/32* (2006.01)
*H01L 35/34* (2006.01)

(52) U.S. Cl.
CPC .............. *H01L 35/32* (2013.01); *H01L 35/34* (2013.01)

(58) Field of Classification Search
CPC ................................ H01L 35/32; H01L 35/34
(Continued)

(56) References Cited

U.S. PATENT DOCUMENTS

| 3,870,568 A | 3/1975 | Oesterhelt et al. |
| 4,257,822 A | 3/1981 | Gomez |

(Continued)

FOREIGN PATENT DOCUMENTS

| CN | 1351764 A | 5/2002 |
| CN | 1773740 A | 5/2006 |

(Continued)

OTHER PUBLICATIONS

Riffat et al., "Thermoelectrics: A Review of Present and Potential Applications," Applied Thermal Engineering, No. 23, pp. 913-935, 2003.
(Continued)

*Primary Examiner* — Jayne Mershon
(74) *Attorney, Agent, or Firm* — Wolf, Greenfield & Sacks, P.C.

(57) ABSTRACT

An integrated circuit may include a substrate and a dielectric layer formed over the substrate. A plurality of p-type thermoelectric elements and a plurality of n-type thermoelectric elements may be disposed within the dielectric layer that are connected in series while alternating between the p-type and the n-type thermoelectric elements. The integrated circuit may include first and second substrates each having formed thereon a plurality of thermoelectric legs of a respective type of thermoelectric material. The first and second thermoelectric substrates also may have respective conductors, each coupled to a base of an associated thermoelectric leg and forming a mounting pad for coupling to a thermoelectric leg of the counterpart substrate. In other embodiments, one or more substrates may have trenches formed therein to capture eutectic material that facilitates bonds between components from each of the substrates and prevent inadvertent short circuits that may occur between components of the circuit system.

21 Claims, 14 Drawing Sheets

Related U.S. Application Data is a continuation-in-part of application No. 13/736,783, filed on Jan. 8, 2013, now Pat. No. 9,620,700.

(58) Field of Classification Search
USPC .......................................................... 136/224
See application file for complete search history.

(56) References Cited

U.S. PATENT DOCUMENTS

| | | | |
|---|---|---|---|
| 5,006,178 | A | 4/1991 | Bijvoets |
| 5,022,928 | A | 6/1991 | Buist |
| 5,610,366 | A | 3/1997 | Fleurial et al. |
| 5,747,728 | A | 5/1998 | Fleurial et al. |
| 6,100,463 | A | 8/2000 | Ladd et al. |
| 6,614,122 | B1 | 9/2003 | Dory et al. |
| 7,629,531 | B2 | 12/2009 | Stark |
| 8,399,300 | B2 | 3/2013 | Lee et al. |
| 8,853,799 | B2 | 10/2014 | O'Donnell et al. |
| 8,957,488 | B2 | 2/2015 | Keysar et al. |
| 9,620,698 | B2 | 4/2017 | Lane et al. |
| 9,620,700 | B2 | 4/2017 | Chen |
| 2005/0139249 | A1 | 6/2005 | Ueki et al. |
| 2006/0048809 | A1 | 3/2006 | Onvural |
| 2006/0118159 | A1* | 6/2006 | Tsuneoka ................ H01L 35/04 136/211 |
| 2006/0151021 | A1 | 7/2006 | Stark |
| 2008/0178606 | A1 | 7/2008 | Chen et al. |
| 2010/0205920 | A1 | 8/2010 | Czubarow et al. |
| 2011/0041887 | A1 | 2/2011 | Takahashi |
| 2011/0209740 | A1 | 9/2011 | Bell et al. |
| 2011/0209744 | A1 | 9/2011 | Hu |
| 2011/0220162 | A1 | 9/2011 | Siivola et al. |
| 2012/0031450 | A1 | 2/2012 | Kittler et al. |
| 2012/0090656 | A1 | 4/2012 | Snyder et al. |
| 2012/0103379 | A1 | 5/2012 | Krinn et al. |
| 2013/0014516 | A1 | 1/2013 | Yang et al. |
| 2013/0081665 | A1 | 4/2013 | Span |
| 2013/0118541 | A1 | 5/2013 | Lee et al. |
| 2013/0133338 | A1 | 5/2013 | Ludwig |
| 2013/0199593 | A1 | 8/2013 | Higashida et al. |
| 2013/0218241 | A1 | 8/2013 | Savoy et al. |
| 2014/0190542 | A1 | 7/2014 | Lane et al. |
| 2014/0190543 | A1 | 7/2014 | Chen |
| 2014/0246066 | A1 | 9/2014 | Chen et al. |
| 2015/0001729 | A1 | 1/2015 | Lan et al. |
| 2016/0133816 | A1 | 5/2016 | Cornett et al. |

FOREIGN PATENT DOCUMENTS

| | | |
|---|---|---|
| CN | 1783526 A | 6/2006 |
| CN | 101887944 A | 11/2010 |
| CN | 102414852 A | 4/2012 |
| CN | 103098249 A | 5/2013 |
| WO | WO 2012/066788 A2 | 5/2012 |

OTHER PUBLICATIONS

Bell, "Cooling, Heating, Generating Power, and Recovering Waste Heat with Thermoelectric Systems," Science, vol. 321, pp. 1457-1461, Sep. 2008.

Borgesen, "Flip Chip on Organic Substrates," SMTA International Conference Proceedings, Sep. 1999, 9 pages.

Caillat et al., "Development of High Efficiency Segmented Thermoelectric Unicouples," Proceedings of the XX International Conference on Thermoelectrics (ICT 2001), Jun. 2001, 4 pages.

Meng et al., "Multi-Objective and Multi-Parameter Optimization of a Thermoelectric Generator Module," Energy, vol. 71, pp. 367-376, Jul. 2014.

Mijatovic et al., "Technologies for Nanofluidic Systems: Top-down vs. Bottom-up—a Review," Lab on a Chip, Issue 5, 2005, pp. 492-500, first published Mar. 22, 2005.

O'Toole et al., "A Solid-Liquid-Vapor Mechanism for Anisotropic Silicon Etching," Applied Physics Letters 93, 263107 (2008), 3 pages.

E.S. Reddy et al., "Fabrication and Properties of Four-Leg Oxide Thermoelectric Modules," Journal of Physics D: Applied Physics, No. 38, pp. 3751-3755, Sep. 2005.

Strasser et al., "Micromachined CMOS Thermoelectric Generators as On-Chip Power Supply," 12th International Conference on Solid-State Sensors, Actuators and Microsystems (Transducers 2003), pp. 45-48, Jun. 2003.

Xie et al., "Design, Fabrication, and Characterization of CMOS MEMS-Based Thermoelectric Power Generators," IEEE Journal of Microelectromechanical Systems, vol. 19, No. 2, pp. 317-321, Apr. 2010.

Y.T. Yeh et al., "Threshold Current Density of Electromigration in Eutectic SnPb Solder," Applied Physics Letters 86, 203504 (2005), 3 pages.

* cited by examiner

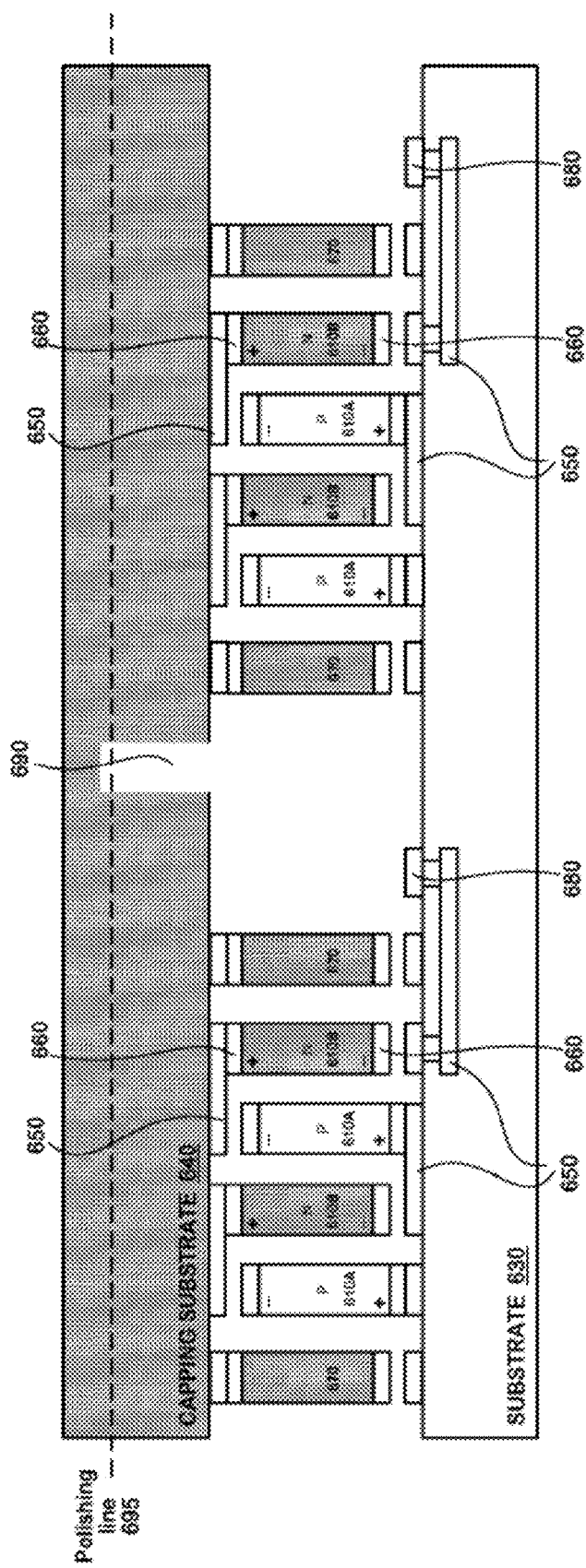

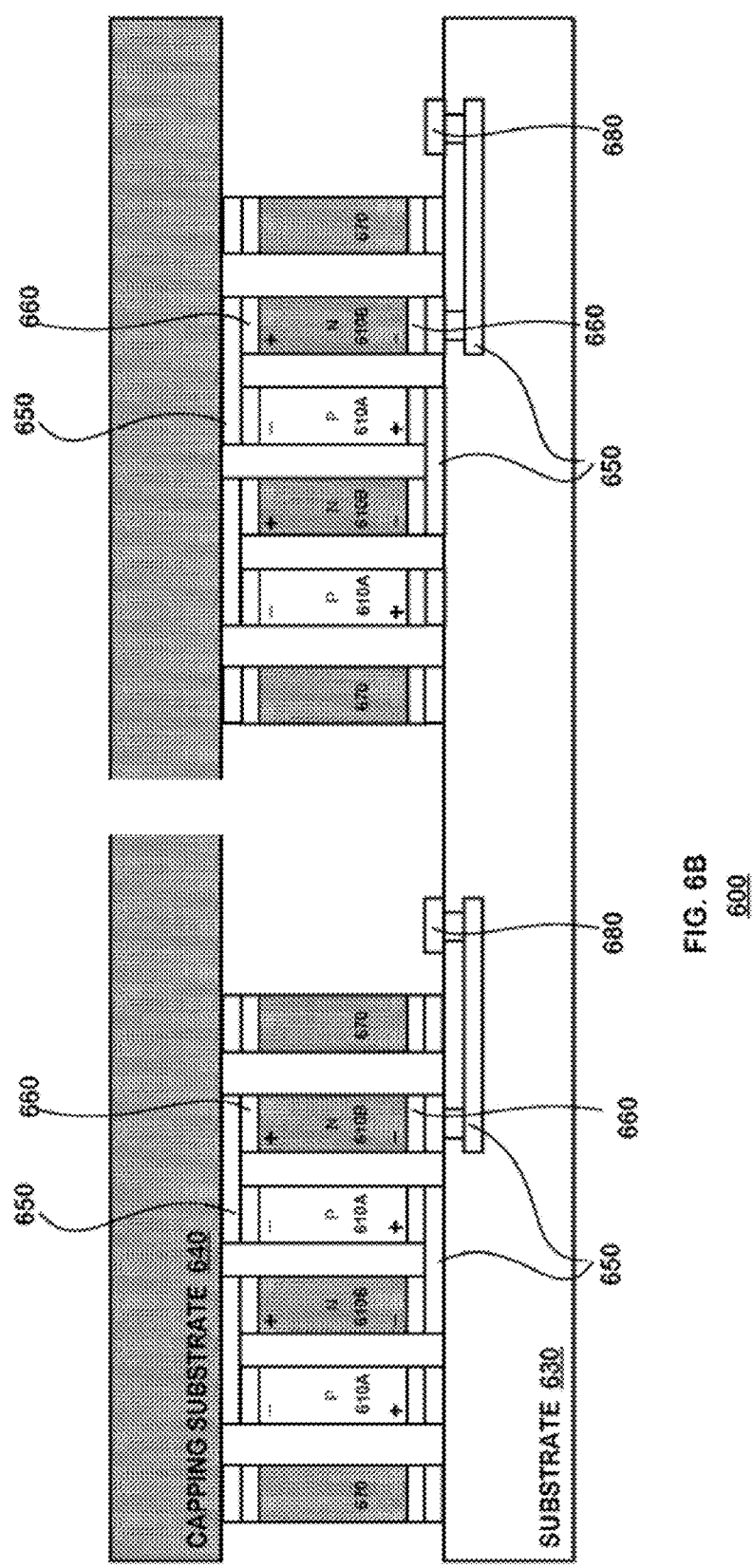

600

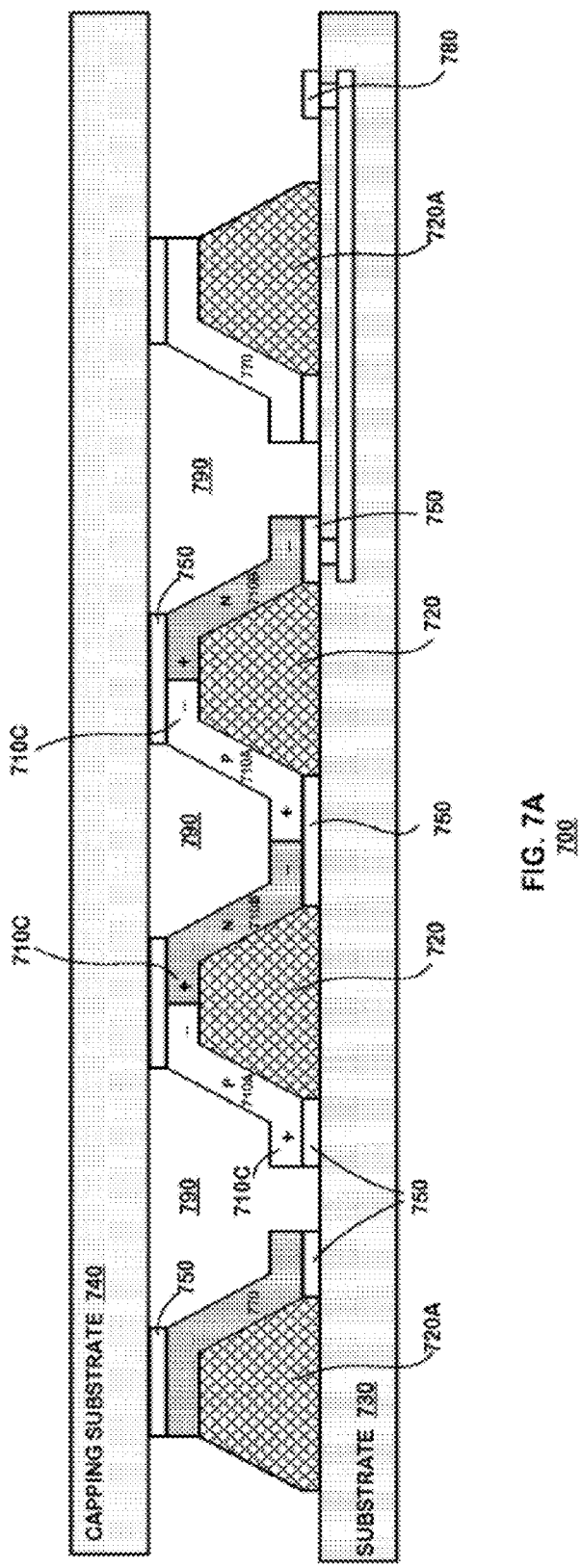

700

700

800

US 9,960,336 B2

WAFER SCALE THERMOELECTRIC ENERGY HARVESTER HAVING TRENCHES FOR CAPTURE OF EUTECTIC MATERIAL

RELATED APPLICATIONS

This application is a continuation-in-part of U.S. application Ser. No. 14/274,590, filed May 9, 2014, which is a continuation-in-part of U.S. application Ser. No. 13/736,783, filed Jan. 8, 2013, the disclosures of which are incorporated herein by reference.

BACKGROUND

The subject matter of this application is directed to a thermoelectric energy harvester, and more particularly to an integrated single chip thermoelectric energy harvester.

Thermoelectric devices convert heat (e.g., thermal energy) into electric energy. A temperature difference between a hot side and a cold side of a thermoelectric device moves charge carriers in a semiconductor material of the thermoelectric device to generate electric energy. The material of the thermoelectric device is selected such that it is a good conductor of electricity to generate the current flow but a poor conductor of heat to maintain the needed heat difference between the two sides of the thermoelectric device. The temperature difference can be generated when the one side of the thermoelectric device is placed near a heat source (e.g., an engine or a circuit) causing one side of the thermoelectric device to be hotter.

The amount of energy that can be generated by the thermoelectric device depends at least on the temperature difference, type of materials in the thermoelectric device and the size of the thermoelectric device. For example, a greater temperature difference between a hot side and a cold side of the device can generate more current flow. In addition, thermoelectric devices with larger surface areas and/or larger materials generating the current flow have traditionally produced more electric energy. These various factors are adjusted depending on the application for which the thermoelectric device is used.

There is a growing interest to scale down the size of thermoelectric devices for new applications (e.g., self sustainable sensors or mobile devices) and to produce thermoelectric devices which can be part of integrated circuits. However, scaling down the size of the thermoelectric device introduces new challenges such as generating enough energy and keeping manufacturing costs low. In addition, traditional materials and/or arrangements of the materials within the thermoelectric device may not provide the needed energy for certain applications. Other challenges include dealing with parasitic heat loss affecting adjacent components in the integrated circuit.

Accordingly, the inventors have identified a need in the art for small scale thermoelectric devices that include high energy density, are low cost and address parasitic heat loss.

BRIEF DESCRIPTION OF THE DRAWINGS

So that features of the present invention can be understood, a number of drawings are described below. It is to be noted, however, that the appended drawings illustrate only particular embodiments of the disclosure and are therefore not to be considered limiting of its scope, for the invention may encompass other equally effective embodiments.

FIGS. 6A-6C illustrate exemplary configurations of a thermoelectric energy harvester according to another embodiment of the present invention.

FIGS. 7A-7C illustrate exemplary configurations of a thermoelectric energy harvester according to another embodiment of the present invention.

DETAILED DESCRIPTION

Figure 1A:
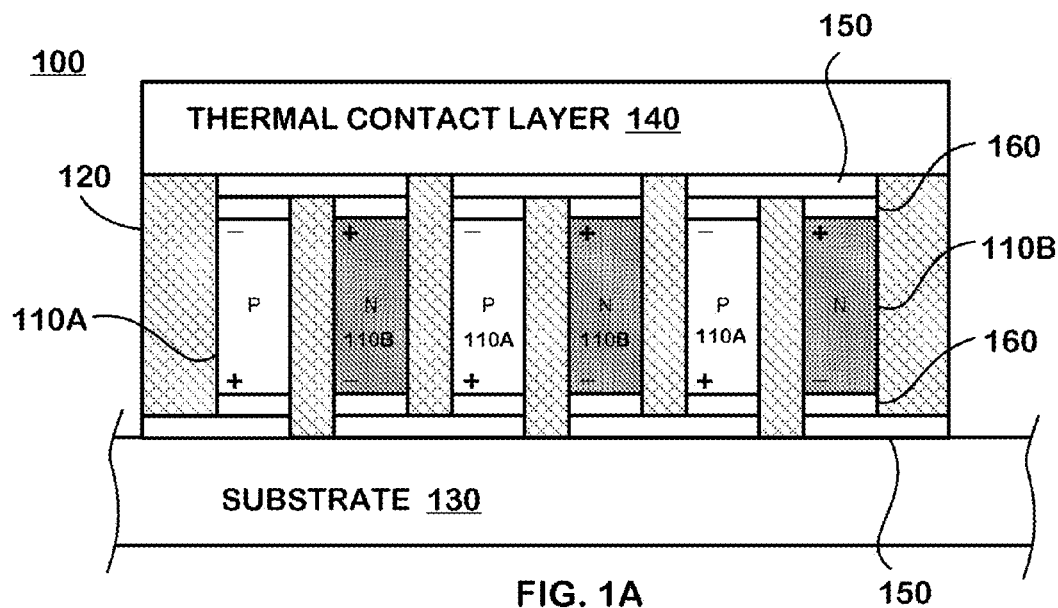
FIGS. 1A and 1B illustrate an exemplary configuration of a thermoelectric energy harvester according to an embodiment of the present invention.

Embodiments of the present invention may provide for a thermoelectric energy harvester that can be provided in an integrated circuit. In one embodiment, an integrated circuit may include a substrate and a dielectric layer formed over the substrate. A plurality of p-type thermoelectric elements and a plurality of n-type thermoelectric elements may be disposed within the dielectric layer. The p-type thermoelectric elements and the n-type thermoelectric elements may be electrically connected in series in an alternating fashion. In response to heat being applied to one side of the thermoelectric elements, flow of electrons may be generated in each of the thermoelectric elements to provide electric energy.

The integrated circuit may include first and second substrates each having formed thereon a plurality of thermoelectric legs of a respective type of thermoelectric material. The first and second thermoelectric substrates also may have respective conductors, each coupled to a base of an associated thermoelectric leg and forming a mounting pad for coupling to a thermoelectric leg of the counterpart substrate.

In other embodiments, one or more substrates may have trenches formed therein to capture eutectic material that facilitates bonds between components from each of the substrates and prevent inadvertent short circuits that may occur between components of the circuit system.

In another embodiment, a cap may be provided above a substrate to enclose a plurality of p-type and n-type thermoelectric elements disposed above the substrate and connected in series while alternating between the p-type and the n-type thermoelectric elements. A vacuum or a low pressure may be maintained between the thermoelectric elements. The cap and the vacuum or low pressure may reduce parasitic heat loss into the area surrounding the integrated circuit and thus maintain a large thermal gradient along the thermoelectric elements.

In an embodiment, a seal may be formed by a dummy structure around the active thermoelectric elements. A vacuum or a low pressure may be maintained between the thermoelectric elements and/or within the seal. The dummy structure may be in the form of a ring and may be formed using some of the same steps in the fabrication processes used to form the active thermoelectric elements. The seal may be also used to prevent contaminants from entering into the active thermoelectric elements during manufacturing process.

In an embodiment, the active thermoelectric elements may be horizontally sloped and vertically sloped, i.e., sloped in two dimensions relative to the direction of thermal gradient across the integrated circuit in order to maximize the thermal length (length of thermal energy flow) through each active thermoelectric element.

In an embodiment, a plurality of thermoelectric elements all connected in series may include only one type of thermoelectric elements, i.e., only n-type or only p-type connected in series. A purely n-type or purely p-type thermoelectric energy harvester may be much simpler to manufacture with fewer process steps.

FIG. 1A illustrates an exemplary configuration of a thermoelectric energy harvester 100 according to an embodiment of the present invention. The thermoelectric energy harvester 100 may include a plurality of thermoelectric elements 110A, 110B above a substrate layer 130 and within a dielectric layer 120. The thermoelectric elements 110A, 110B may include elements of different types of thermoelectric material (e.g., p-type and n-type). The thermoelectric elements 110A, 110B may be interconnected such that each thermoelectric element contributes to the overall energy provided by the thermoelectric energy harvester 100 in response to a temperature gradient between a first side (e.g., hot side) and a second side (e.g., cold side). A thermal contact layer 140 may be provided above the dielectric layer 120 to support the temperature gradients between the first side and the second side. The thermal contact layer 140 may be made of a material that is a good heat conductor.

As shown in FIG. 1A, the thermoelectric energy harvester 100 may include a vertical structure provided with the dielectric layer 120 and may be formed as a single wafer. The wafer scale structure of the thermoelectric energy harvester 100 allows it to be integrated with other integrated circuit components (not shown in FIG. 1A) on or near the substrate 130.

As indicated, the thermoelectric elements 110A, 110B may include different types of thermoelectric materials (e.g., p-type and n-type). The thermoelectric material of the thermoelectric elements 110A, 110B may be selected to generate a flow of charge carriers of different polarity from one end of the thermoelectric element to an opposite end in response to a temperature difference between the two ends. In a thermoelectric element 110A, including p-type material, the positive charge carriers flow from a hot end to an opposite cold end. In contrast, in a thermoelectric element 110B including n-type material, the electrons flow from an end having the heat source to the opposite end which is cooler.

The plurality of the thermoelectric elements 110A, 110B may be connected in an array while alternating the type of material (e.g., between n-type and p-type) in the adjacent thermoelectric elements 110A and 110B. In this manner, the voltages and/or currents that are developed across the thermoelectric elements 110A and 110B may be summed together to generate a larger aggregate voltage and/or current than the thermoelectric elements 110A and 110B do individually. For example, thermoelectric elements 110A having p-type material may be connected in series with thermoelectric elements 110B having n-type material. The thermoelectric elements 110A, 110B may be arranged such that all of the adjacent thermoelectric elements to a given thermoelectric element include a type of material that is different to the material of the given thermoelectric element. Outputs of the arrays of the thermoelectric elements 110A and 110B may be connected in parallel to provide the energy required in a particular application. Interconnects 150 may connect the thermoelectric elements 110A and 110B to adjacent thermoelectric elements 110A and 110B.

While each thermoelectric element 110A, 110B may provide a small amount of energy (e.g., millivolts), connecting the thermoelectric elements 110A, 110B in an array may provide the higher energy needed for a particular application. When heat is applied to one side of the thermoelectric energy harvester 100, electrons in the thermoelectric elements 110A having p-type material will flow from the cold side to the hot side of the thermoelectric elements 110A and the electrons in the thermoelectric elements 110B having n-type material will flow from the hot side to the cold side of the thermoelectric elements 110B. Thus, if the thermoelectric elements 110A are connected in series with the thermoelectric elements 110B, forming a thermoelectric couple, the electrons will flow from a cold side of the p-type material, to a hot side of the p-type material, into the hot side of the n-type material via the interconnect 150, and into the cold side of the n-type material. The energy generated in each of the thermoelectric elements 110A, 110B is combined and provided at the output terminals of the thermoelectric energy harvester 100.

Figure 1B:
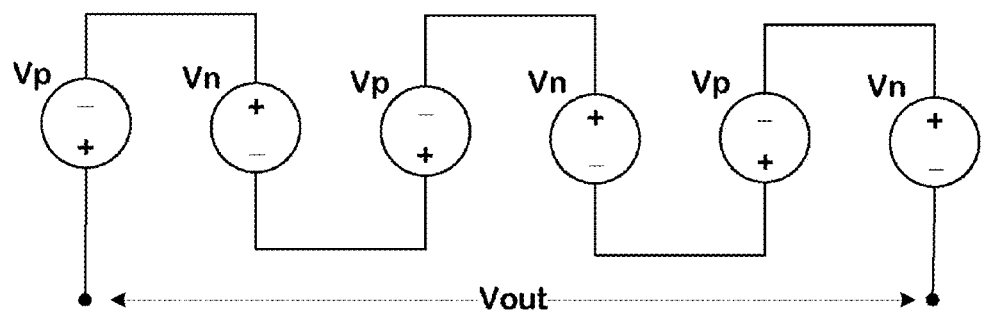

FIG. 1B illustrates a circuit equivalent of the thermoelectric energy harvester 100 shown in FIG. 1A. The voltages that are developed across the thermoelectric elements 110A and 110B are represented by Vp and Vn. The individual voltages and/or currents may be summed together to provide and aggregate output voltage Vout, and in the case drawn, the voltage is summed to get a useful voltage that can power a typical low power electronic circuit.

FIG. 1A is not drawn to scale but describes coarse dimensions of a harvester 100 in one embodiment. The thermoelectric elements 110A, 110B may have a shape that maximizes the surface of the thermoelectric element 110A, 110B that is adjacent to the dielectric layer 120. The thermoelectric elements 110A, 110B may have a rectangular shape with the sides having a longer end being adjacent to the dielectric layer 120 and the shorter sides being adjacent to the interconnects 150. In another embodiment, at least one side of the thermoelectric elements 110A, 110B may be a square.

The material of the thermoelectric elements 110A, 110B may be selected such that the thermal resistance of the thermoelectric elements 110A, 110B is smaller than the thermal resistance of the dielectric layer 120 so that the dielectric layer will not cause too much thermal shunting. A high thermal resistance of the thermoelectric elements 110A, 110B is still needed to ensure that a good temperature difference is maintained between a hot side and a cold side of the thermoelectric elements 110A, 110B. The thermal resistance of the thermoelectric elements 110A, 110B may be increased by the controlling of the doping level of the thermoelectric elements 110A, 110B or by introducing scattering elements to increase the photon scattering in the thermoelectric elements 110A, 110B without affecting too much of their electric conduction. The concentration of the doping level or the scattering elements may be increased or decreased at one end of the thermoelectric elements 110A, 110B as compared to an opposite end of the thermoelectric element 110A, 110B.

For example, thermoelectric elements 110A can be p-type BixSb2-xTe3 and thermoelectric elements 110B can be n-type Bi2Te3-xSex. The dielectric layer 120 can be a polyimide, as it has low thermal conductivity and it helps on processing of the thermoelectric elements. The thermal contact layer 140 can be any electrically insulating but thermally conductive layer. In one embodiment, the thermal contact layer 140 can be made of multiple layers. For example, the thermal contact layer 140 may include a thin non-conductive layer such as oxide or nitride and one or more thicker metal layers on top to enhance thermal conduction. The thermal contact layer 140 may provide insulation at the interface to electric interconnection layer 150 to prevent electric short of electric interconnection layers 150. The substrate 130 can be any semiconducting substrate with enough thickness to promote thermal conduction at the bottom side. While the configuration of the substrate 130 as cold side and the top thermal contact layer 140 as the hot side is shown, the device can also function with the substrate 130 as the hot side and top thermal contact layer 140 as the cold side.

The interconnects 150 may be included on a hot side and on a cold side of the thermoelectric elements to connect adjacent thermoelectric elements. The thermoelectric elements may include a first interconnect on a hot side coupled to a first thermoelectric element and a second interconnect on a cold side coupled to a second thermoelectric element. The interconnects 150 at the first and last thermoelectric elements 110A, 110B may be output terminals to connect to other circuit components (e.g., external circuits, load or an energy storage device). The interconnects 150 may include a semiconductor material or a metallic connector (e.g., gold, copper or aluminum).

In the exemplary embodiments, the dielectric layer 120 may be high dielectric breakdown materials such as polyimide, silicon dioxide, silicon nitride and the like. The dielectric layer 120 may electrically insulate the thermoelectric elements 110A, 110B. The dielectric layer 120 may suppress the conduction of heat away from the thermoelectric elements 110A, 110B. The dielectric layer 120 may have a lower thermal conductivity than the substrate 130 and/or the thermoelectric elements 110A, 110B. The dielectric layer 120 may surround the thermoelectric elements 110A, 110B at four sides to thermally shunt the thermoelectric elements 110A, 110B and allow the thermal gradient to be developed across the thermoelectric elements 110A, 110B and to allow most heat to travel to the sides of the thermoelectric energy harvester 100. Higher thermal resistance of the thermoelectric elements 110A, 110B as compared to the thermal resistance of the substrate 130 and/or thermal contact layer 140, allows the available thermal gradient to drop across the thermoelectric elements 110A, 110B rather than the thermal contact layer 140 or the substrate 130. Thus, a maximum temperature difference is maintained between the hot side and the cool side of the thermoelectric elements 110A, 110B.

Barrier metals 160 may be included between the thermoelectric elements 110A, 110B and the interconnects 150 to isolate the semiconductor materials of the thermoelectric elements 110A, 110B from the metal interconnects 150, while maintaining an electrical connection between the thermoelectric elements 110A, 110B and the interconnects 150. The barrier metals 160 may be included to prevent diffusion of the interconnects 150 into the semiconductor materials of the thermoelectric elements 110A, 110B.

When heat is applied to one side (e.g., hot side) of the thermoelectric energy harvester 100, electrons flow in one direction in the thermoelectric elements 110A having the p-type material and in another direction in the thermoelectric elements 110B having the n-type material. Because the thermoelectric elements 110A, 110B are connected in series, the energy generated in each of the thermoelectric elements 110A, 110B is combined to provide the combined energy at the outputs of the thermoelectric energy harvester 100. The incoming heat is distributed by the thermal contact layer 140 to the hot side of the thermoelectric elements 110A, 110B while the substrate 130 cools the cool side of the thermoelectric elements 110A, 110B.

Figure 2:
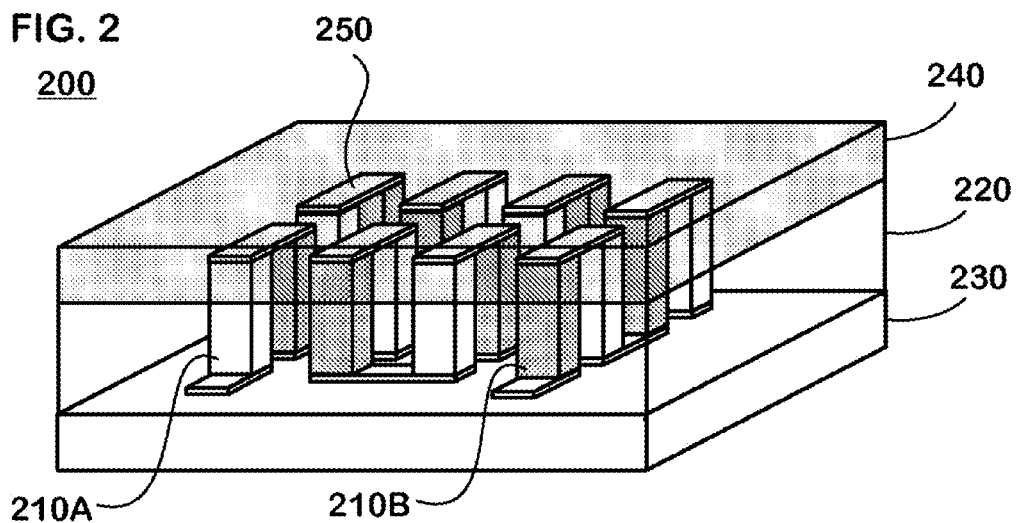
FIG. 2 illustrates a perspective view of a thermoelectric energy harvester according to an embodiment of the present invention.

FIG. 2 illustrates a perspective view of a thermoelectric energy harvester 200 according to an embodiment of the present disclosure. As shown in FIG. 2, the thermoelectric elements 210A, 210B are provided above the substrate layer 230. A dielectric layer 220 is provided above the substrate layer 230 to electrically isolate the thermoelectric elements 210A, 210B from each other. The thermoelectric elements 210A, 210B may be arranged in an array such that the thermoelectric elements 210A, 210B while alternating the type of material (e.g., between n-type and p-type) in the adjacent thermoelectric elements 210A and 210B. Interconnects 250 may connect the thermoelectric elements 210A, 210B in series. A thermal contact layer 240 may disperse the applied heat to the thermoelectric elements 210A, 210B.

Figure 3:
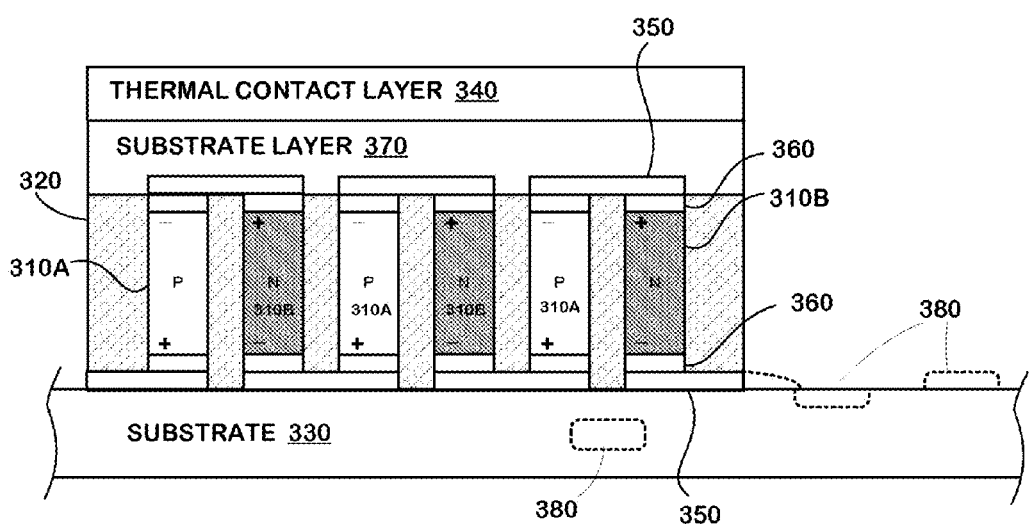
FIG. 3 illustrates an exemplary configuration of a thermoelectric energy harvester according to another embodiment of the present invention.

FIG. 3 illustrates an exemplary configuration of a thermoelectric energy harvester 300 according to another embodiment of the present disclosure. The thermoelectric energy harvester 300 may include a plurality of thermoelectric elements 310A, 310B above the substrate layer 330 and within a dielectric layer 320 above the substrate layer 330. The thermoelectric elements 310A, 310B may be arranged in an array while alternating the type of material (e.g., between n-type and p-type) in the adjacent thermoelectric elements 310A and 310B. The plurality of thermoelectric elements 310A, 310B may be connected in series via interconnects 350. A thermal contact layer 340 may be provided above the thermoelectric elements 310A, 310B to dissipate the heat applied to the thermoelectric energy harvester 300.

The thermoelectric energy harvester 300 may include an additional substrate layer 370 between the thermal contact layer 340 and the dielectric layer 320. The substrate layer 370 may have a high thermal conductivity to dissipate heat from the external heat source. The substrate layer 370 may be an aluminum nitride substrate.

The thermoelectric energy harvester 300 may include one or more circuit components 380 in the substrate 330 and/or on a surface of the substrate 330. The circuit components 380 may be coupled the output terminals of the thermoelectric energy harvester 300. The circuit components 380 may receive the energy generated by the thermoelectric energy harvester 300 and/or control the thermoelectric energy harvester 300. The circuit components 380 may be parts of a sensor (e.g., automotive sensor, medical implant, and/or wireless sensor) being powered by the thermoelectric energy harvester 300. In one embodiment, current may be supplied to the thermoelectric elements 310A, 310B via the circuit components 380 for the thermoelectric energy harvester 300 to function as a cooler. The thermoelectric energy harvester 300 functioning as a cooler may cool circuit components 380 within the substrate 330 or provided near or on the surface of the substrate 330. The current applied to the thermoelectric elements 310A, 310B may create a flow of charge carriers that generate a temperature difference between the two sides of the thermoelectric energy harvester 300 that can be used to cool the circuit components 380.

Barrier metals 360 may be included between the thermoelectric elements 310A, 310B and the interconnects 350 to isolate the semiconductor materials of the thermoelectric elements 310A, 310B from the metal interconnects 350, while maintaining an electrical connection between the thermoelectric elements 310A, 310B and the interconnects 350.

Figure 4:
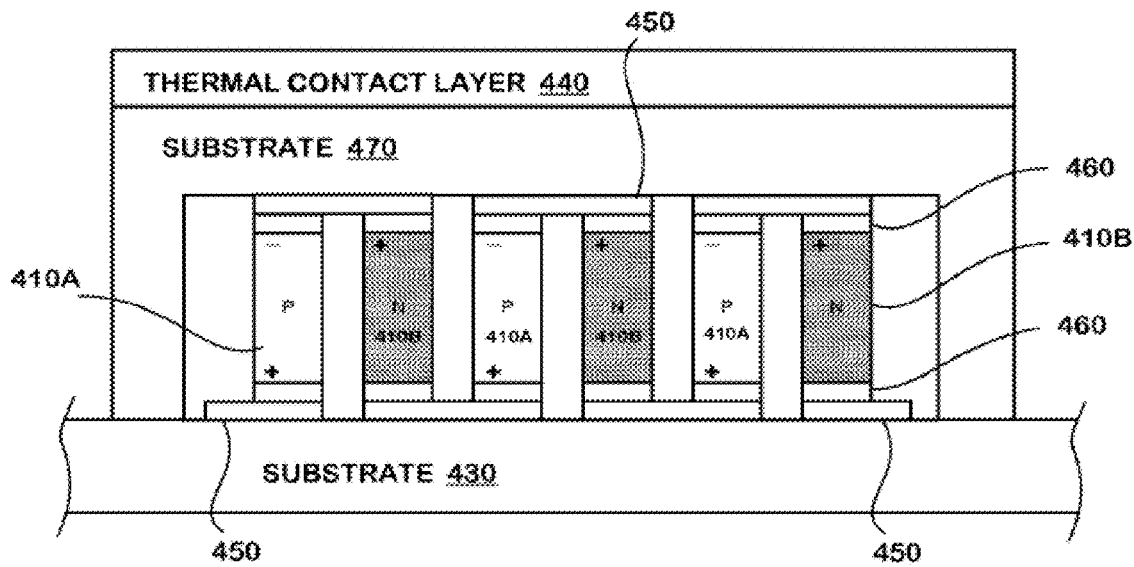
FIG. 4 illustrates an exemplary configuration of a thermoelectric energy harvester with a capping structure according to an embodiment of the present invention.

FIG. 4 illustrates an exemplary configuration of a thermoelectric energy harvester 400 with a capping structure according to an embodiment of the present disclosure. The thermoelectric energy harvester 400 may include a capping substrate 470 to enclose the thermoelectric elements 410A, 410B provided above the substrate 430. The capping substrate 470 may allow for low pressure or vacuum to be maintained between the substrate 430 and the capping substrate 470.

The capping substrate 470 may enclose the thermoelectric elements 410A, 410B between the capping substrate 470 and the substrate 410. The capping substrate 470 may be attached to the substrate 410 under pressure or vacuum such that the low pressure or vacuum is provided around the thermoelectric elements 410A, 410B.

The capping substrate 470 and/or the low pressure or vacuum may reduce the parasitic heat loss into the area surrounding the thermoelectric elements 410A, 410B. Reducing the parasitic heat loss allows for the thermoelectric energy harvester 400 to be scaled down and included as part of an integrated circuit. Reduced parasitic heat loss at small levels allows for other circuits to be included together with the thermoelectric energy harvester 400.

The capping substrate 470 may allow for more energy to be harvested by the thermoelectric energy harvester 400. The vacuum or low pressure allows for the temperature gradient between the hot and cold side of the thermoelectric elements 410A, 410B to be maximized.

Similar to the embodiments shown in FIGS. 1-3, the thermoelectric elements 410A, 410B may be arranged in an array with alternating types of material (e.g., between n-type and p-type) in the adjacent thermoelectric elements 410A and 410B. The plurality of thermoelectric elements 410A, 410B may be connected in series via interconnects 450. A thermal contact layer 440 may be provided above the thermoelectric elements 410A, 410B to dissipate the heat to the thermoelectric elements 410A, 410B.

Barrier metals 460 may be included between the thermoelectric elements 410A, 410B and the interconnects 450 to isolate the materials of the thermoelectric elements 410A, 410B from the interconnects 450, while maintaining an electrical connection between the thermoelectric elements 410A, 410B and the interconnects 450.

In one embodiment, the p-type and the n-type thermoelectric elements may both be provided on one of the capping substrate 470 and the substrate 430 before bonding the capping substrate 470 to the substrate 430. In another embodiment, before the capping substrate 470 is bonded to the substrate 430, p-type thermoelectric elements may be provided on one of the capping substrate 470 and the substrate 430 and the n-type thermoelectric elements may be provided on the other one of the capping substrate 470 and the substrate 430. Bonding the capping substrate 470 to the substrate 430 would couple the p-type thermoelectric elements and the n-type thermoelectric elements.

Figure 5:
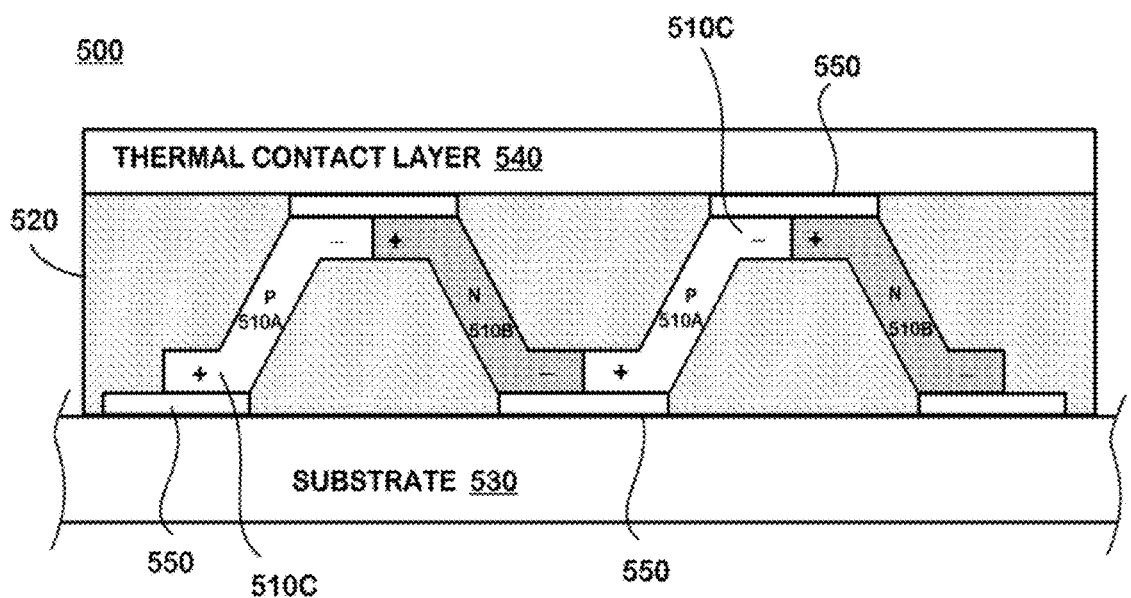
FIG. 5 illustrates an exemplary configuration of a thermoelectric energy harvester according to another embodiment of the present invention.

As shown in FIGS. 1-4, the thermoelectric elements are shown having a rectangular vertical structure. However, the thermoelectric elements may include various shapes and orientations. FIG. 5 illustrates an exemplary configuration of a thermoelectric energy harvester 500 according to another embodiment of the present invention. The thermoelectric energy harvester 500 may include a plurality of thermoelectric elements 510A, 510B above the substrate layer 530 and within a dielectric layer 520 above the substrate layer 530. The thermoelectric elements 510A, 510B may be arranged in an array while alternating the type of material (e.g., between n-type and p-type) in the adjacent thermoelectric elements 510A and 510B. The plurality of thermoelectric elements 510A, 510B may be connected in series via interconnects 550. A thermal contact layer 540 may be provided above the thermoelectric elements 510A, 510B to dissipate the heat applied to the thermoelectric energy harvester 500.

As shown in FIG. 5, the thermoelectric elements 510A and 510B may be slanted. In addition, the thermoelectric elements 510A and 510B may include connecting portions 510C on one or both ends of the thermoelectric elements 510A and 510B that connect to the interconnects 550. The dielectric layer 520 may allow for the thermoelectric elements 510A and 510B to include various shapes and orientations. The orientation and/or shape of the thermoelectric elements 510A and 510B may be changed based on available space for the thermoelectric energy harvester 500 and/or the system performance requirements. Changing the orientation of the thermoelectric elements 510A and 510B may reduce the space available (e.g., vertical space), while maximizing the surface area of the thermoelectric element 510A and 510B that is adjacent to the dielectric layer 520.

FIG. 6A illustrates an exemplary configuration of a thermoelectric energy harvester 600 according to an embodiment of the present invention. The thermoelectric energy harvester 600 may include a plurality of thermoelectric elements 610A, 610B above a substrate layer 630. The thermoelectric elements 610A, 610B may include elements of different types of thermoelectric material (e.g., p-type and n-type). The thermoelectric elements 610A, 610B may be interconnected such that each thermoelectric element contributes to the overall energy provided by the thermoelectric energy harvester 600 in response to a temperature gradient between a first side (e.g., hot side) and a second side (e.g., cold side). A capping substrate 640 may be provided above the thermoelectric elements 610A, 610B to support the temperature gradients between the first side and the second side. The capping substrate 640 may be made of a material that is a good heat conductor.

Dummy structures 670 may be provided around the thermoelectric elements 610A, 610B, to form a seal around the thermoelectric elements 610A, 610B in the horizontal direction. A vacuum or a low pressure may be maintained between the thermoelectric elements and/or within the seal. The dummy structures 670 may be in the form of a ring, and may be formed using some of the same steps in the fabrication processes used to form the active thermoelectric elements. The seal may be also used to prevent contaminants from entering into the active thermoelectric elements during manufacturing process. Additionally, the dummy structures 670 may minimize thermal conduction, and thus decrease thermal energy loss in the horizontal direction.

As shown in FIG. 6A, the thermoelectric energy harvester 600 may be formed with thermoelectric elements 610A, 610B separately on two different substrates 630 and 640. Here, for example, substrate 640 may be formed for n-type elements, and substrate 630 may be formed for p-type elements. The dummy structures 670 may be also formed on one of the substrates 630 and 640. The dummy structures 670 may be formed from n-type thermoelectric material, or p-type thermoelectric material, but may be made inactive by disconnecting the dummy structures 670. In doing so, the dummy structures 670 may be formed as part of the manufacturing process using the same steps for forming the thermoelectric elements 610A and 610B, without the need for additional steps.

In an embodiment, the dummy structures 670 may be formed from a polyimide material, as it has low thermal conductivity and it helps on processing of the thermoelectric elements.

In the manufacturing process, the capping substrate 640 may have scribe lines/notches 690 cut or etched into the substrate 640 to define the outlines of separate integrated circuit dies. The capping substrate 640 may be inverted, aligned and mounted (via metal interconnects) with the substrate 630, such that the thermoelectric elements 610A and 610B are connected to the various interconnects 650 to form strings of alternating thermoelectric elements 610A and 610B in circuit paths. Furthermore, the dummy structures 670 may be also attached between the substrates 630 and 640 to form a seal. During the mounting step, a vacuum or low pressure may be formed between the thermoelectric elements 610A and 610B and inside the seal of the dummy structures 670. The capping substrate 640 may need to be polished down to a thin layer (i.e., to a predetermined polishing line 695). This may make the capping substrate 640 thin and thus more thermally conductive, and also expose the scribe lines/notches 690.

Without the seal of the dummy structures 670, contaminants and particles may be introduced between the thermoelectric elements 610A and 610B during the polishing step, because the scribe lines/notches 690 may be exposed. Thus, the dummy structures 670 aid in forming the vacuum or low pressure as well as prevent contamination during the manufacturing processes.

The wafer scale structure of the thermoelectric energy harvester 600 allows it to be integrated with other integrated circuit components (not shown in FIG. 6A) on or near the substrates 630 and 640.

Figure 6C:
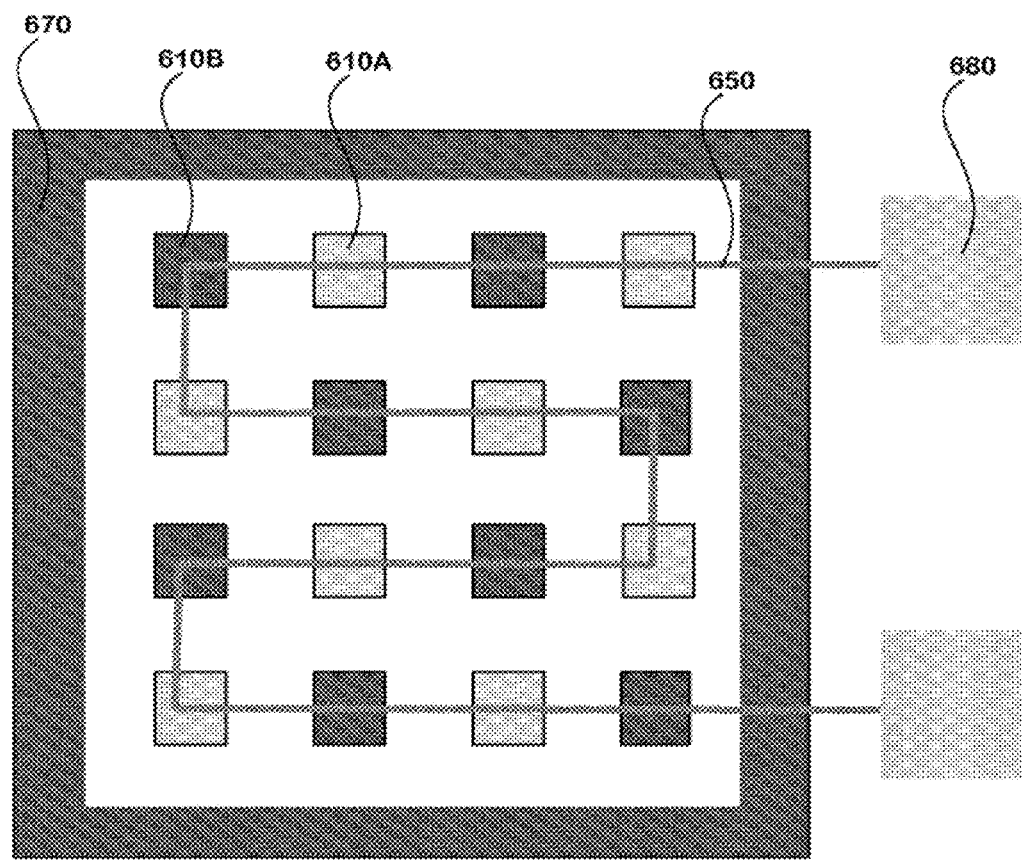

FIGS. 6B and 6C further illustrate the harvester 600 as formed. FIG. 6B illustrates for example, the harvester 600 after mounting of the two substrates 630 and 640, and after the polishing step is completed, exposing the scribe lines/notches 690. FIG. 6C illustrates a general top-down view of the harvester 600 with a ring seal of a dummy structure 670 around the thermoelectric elements 610A and 610B.

As indicated, the thermoelectric elements 610A, 610B may include different types of thermoelectric materials (e.g., p-type and n-type). The thermoelectric material of the thermoelectric elements 610A, 610B may be selected to generate a flow of charge carriers of different polarity from one end of the thermoelectric element to an opposite end, in response to a temperature difference between the two ends. In a thermoelectric element 610A including p-type material, the positive charge carriers flow from a hot end to an opposite cold end. In contrast, in a thermoelectric element 610B, including n-type material, the electrons flow from an end having the heat source to the opposite end which is cooler.

The plurality of the thermoelectric elements 610A, 610B may be connected in an array while alternating the type of material (e.g., between n-type and p-type) in the adjacent thermoelectric elements 610A and 610B. In this manner, the voltages and/or currents that are developed across the thermoelectric elements 610A and 610B may be summed together to generate a larger aggregate voltage and/or current than the thermoelectric elements 610A and 610B do individually. For example, thermoelectric element 610A having p-type material may be connected in series with thermoelectric element 610B having n-type material. The thermoelectric elements 610A, 610B may be arranged such that all of the adjacent thermoelectric elements to a given thermoelectric element include a type of material that is different to the material of the given thermoelectric element. Outputs of the arrays of the thermoelectric elements 610A and 610B may be connected in parallel to provide the energy required in a particular application. Interconnects 650 may connect the thermoelectric elements 610A and 610B to adjacent thermoelectric elements 610A and 610B, and may further connect to a pad 680 (which may be used for bonding to external connections).

While each thermoelectric element 610A, 610B may provide a small amount of energy (e.g., millivolts), connecting the thermoelectric elements 610A, 610B in an array may provide the higher energy needed for a particular application. When heat is applied to one side of the thermoelectric energy harvester 600, electrons in the thermoelectric elements 610A having p-type material will flow from the cold side to the hot side of the thermoelectric elements 610A and the electrons in the thermoelectric elements 610B having n-type material will flow from the hot side to the cold side of the thermoelectric elements 610B. Thus, if the thermoelectric elements 610A are connected in series with the thermoelectric elements 610B, forming a thermoelectric couple, the electrons will flow from a cold side of the p-type material, to a hot side of the p-type material, into the hot side of the n-type material via the interconnects 650, and into the cold side of the n-type material. The energy generated in each of the thermoelectric elements 610A, 610B is combined and provided at the output terminals of the thermoelectric energy harvester 600.

FIG. 6A is not drawn to scale but describes coarse dimensions of a harvester 600 in one embodiment. The thermoelectric elements 610A, 610B may have a shape that maximizes the lengths of the thermoelectric elements 610A, 610B. The thermoelectric elements 610A, 610B may have a rectangular shape with the sides having a longer length in the vertical direction than the shorter sides being adjacent to the interconnects 650. In another embodiment, at least one side of the thermoelectric elements 610A, 610B may be a square. Furthermore, the dummy structures 670 may be sized such that the overall horizontal area of the seal formed by the dummy structures 670 is minimized relative to the horizontal area of all of the thermoelectric elements 610A, 610B sealed within the seal. This may aid the harvester 600 in minimizing thermal conduction through the dummy structures 670 and minimize thermal loss in the horizontal direction as well.

For example, thermoelectric elements 610A can be p-type $Bi_xSb_{2-x}Te_3$ and thermoelectric elements 610B can be n-type $Bi_2Te_{3-x}Se_x$. The capping substrate 640 can be formed from a semiconductor substrate (such as an n-type wafer), and may be a thermally conductive layer. In one embodiment, the capping substrate 640 can be made of multiple layers. For example, the capping substrate 640 may include a thin non-conductive layer such as oxide or nitride and one or more thicker metal layers on top to enhance thermal conduction. The capping substrate 640 may provide insulation at the interface to electric interconnection layer 650 to prevent electric shorts of electric interconnection layers 650. The substrate 630 can be any semiconducting substrate with enough thickness to promote thermal conduction at the bottom side. While the configuration of the substrate 630 as the cold side and the top capping substrate 640 as the hot side is shown, the device can also function with the substrate 630 as the hot side and top capping substrate 640 as the cold side.

The interconnects 650 may be included on a hot side and on a cold side of the thermoelectric elements to connect adjacent thermoelectric elements. The thermoelectric elements may include a first interconnect on a hot side coupled to a first thermoelectric element and a second interconnect on a cold side coupled to a second thermoelectric element. The interconnects 650 at the first and last thermoelectric elements 610A, 610B may be output terminals to connect to other circuit components (e.g., external circuits, load or an energy storage device). The interconnects 650 may include a semiconductor material or a metallic connector (e.g., gold, copper or aluminum).

The seal of the dummy structures 670 may surround the thermoelectric elements 610A, 610B at four sides to thermally shunt the thermoelectric elements 610A, 610B and allow the thermal gradient to be developed across the thermoelectric elements 610A, 610B and to allow most heat to travel to the sides of the thermoelectric energy harvester 600. Higher thermal resistance of the thermoelectric elements 610A, 610B, as compared to the thermal resistance of the substrate 630 and/or capping substrate 640, allows the available thermal gradient to drop across the thermoelectric elements rather than the thermal contact layer or the substrate 630. Thus, a maximum temperature difference is maintained between the hot side and the cool side of the thermoelectric elements 610A, 610B.

While the seal of the dummy structures 670 may be physically a continuous ring without any opening in order to maintain a vacuum (or separate gas) within, if the vacuum (or separate gas) within is not needed, then the dummy structures 670 may have openings in the horizontal direction.

Barrier metals 660 may be included between the thermoelectric elements 610A, 610B and the interconnects 650 to isolate the semiconductor materials of the thermoelectric elements 610A, 610B from the metal interconnects 650, while maintaining an electrical connection between the thermoelectric elements 610A, 610B and the interconnects 650. The barrier metals 660 may be included to prevent diffusion of the interconnects 650 into the semiconductor materials of the thermoelectric elements 610A, 610B.

When heat is applied to one side (e.g., hot side) of the thermoelectric energy harvester 600, electrons flow in one direction in the thermoelectric elements 610A having the p-type material and in another direction in the thermoelectric elements 610B having the n-type material. Because the thermoelectric elements 610A, 610B are connected in series, the energy generated in each of the thermoelectric elements 610A, 610B is combined to provide the combined energy at the outputs of the thermoelectric energy harvester 600. The incoming heat is distributed by the capping substrate 640 to the hot side of the thermoelectric elements 610A, 610B while the substrate 630 cools the cool side of the thermoelectric elements 610A, 610B.

Figure 7B:
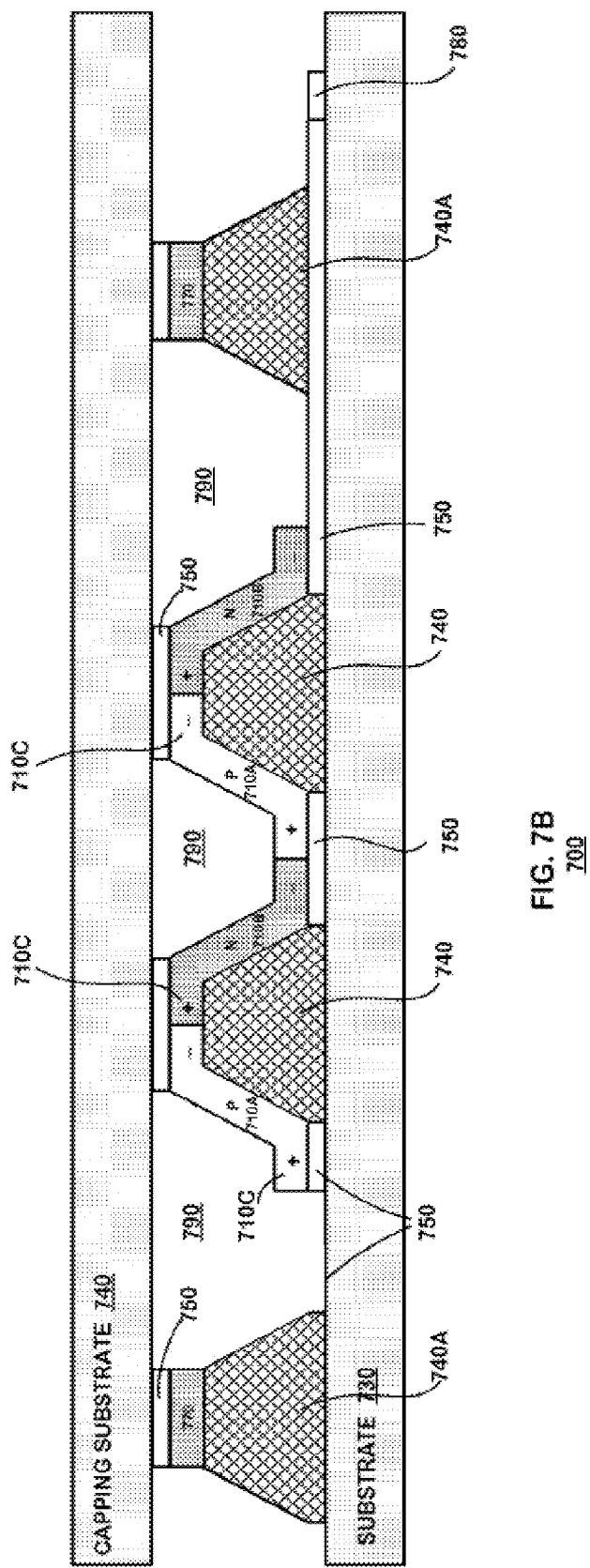
Figure 7C:
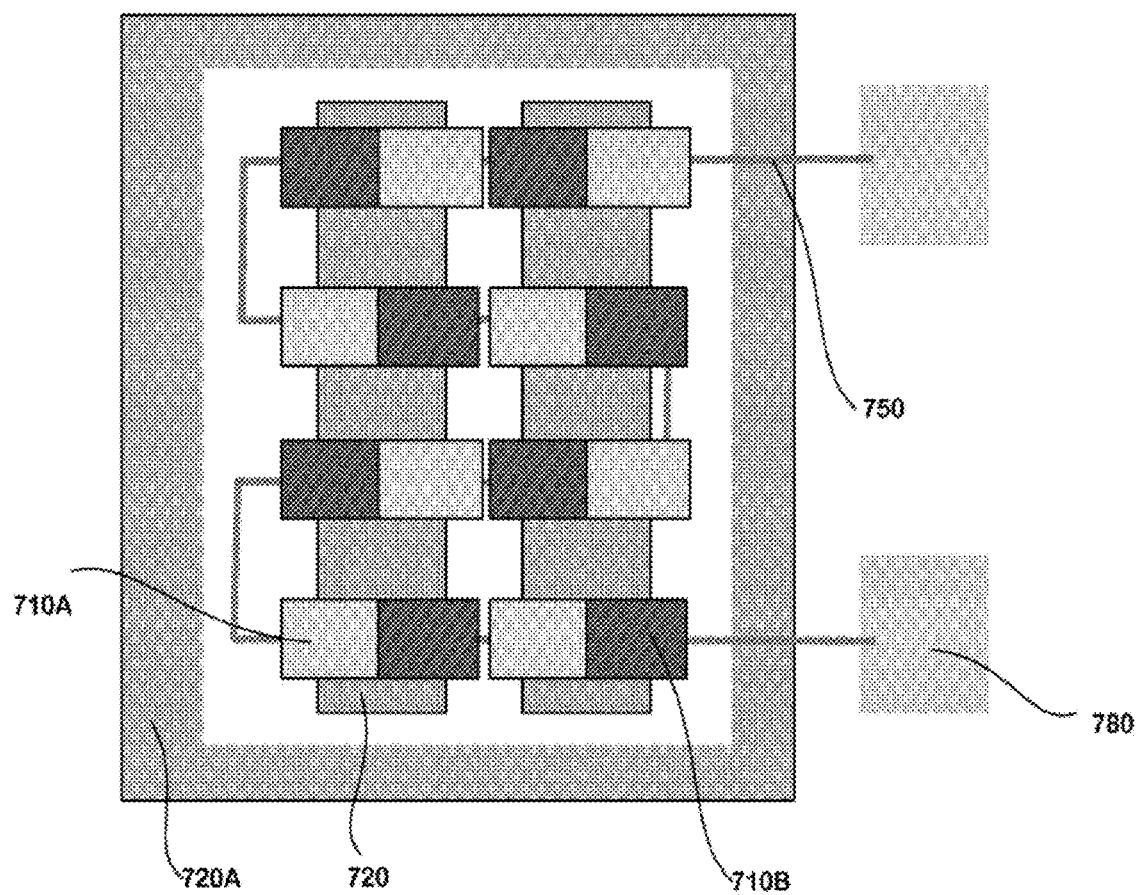

FIGS. 7A-7C illustrate exemplary configurations of a thermoelectric energy harvester 700 according to another embodiment of the present invention.

The thermoelectric energy harvester 700 may include a plurality of thermoelectric elements 710A, 710B between a substrate 730 and a capping substrate 740. The thermoelectric elements 710A, 710B may include alternating elements of different types of thermoelectric material (e.g., p-type and n-type). The thermoelectric elements 710A, 710B may be interconnected electrically such that each thermoelectric element contributes to the overall energy provided by the thermoelectric energy harvester 700 in response to a temperature gradient between a first side (e.g., hot side) and a second side (e.g., cold side).

As shown in FIG. 7A, the thermoelectric elements 710A, 710B may have a run length that is at least the height of the thermoelectric elements 710A, 710B. In one embodiment, the thermoelectric elements 710A, 710B may be slanted. The slanted thermoelectric elements 710A, 710B may have a rectangular or cylindrical shape. In another embodiment, the thermoelectric elements 710A, 710B may have a conical shape or a pyramid shape. In one embodiment, within each row of the thermoelectric elements, the thermoelectric elements 710A may be slanted in one direction and the thermoelectric elements 710B may be slanted in an opposite direction.

The various shapes of the thermoelectric elements 710A, 710B allow for the thermoelectric energy harvester 700 to have a semi-vertical or quasi-lateral structure. These shapes of the thermoelectric elements 710A, 710B may allow for the thickness of the thermoelectric energy harvester 700 to be reduced as compared to the vertical thermoelectric elements shown in FIG. 1A. The shapes and the depth of the thermoelectric elements 710A, 710B may be selected to maximize the surface area of the thermoelectric elements while keeping the thickness of the thermoelectric energy harvester 700 fixed.

The thermoelectric elements 710A and 710B may be formed over a thermoplastic 720 (e.g., polyimide) with low thermal conductivity. The thermoplastic 720 may be provided on a surface of the substrate 730. The thermoplastic 720 may provide support for the thermoelectric elements 710A and 710B. The support for the thermoelectric elements 710A and 710B may be provided on the sloped surface of the thermoplastic 720. The thermoplastic 720 may allow for the thermoelectric elements 710A and 710B to include various shapes and orientations. The orientation and/or shape of the thermoelectric elements 710A and 710B may be changed based available space for the thermoelectric energy harvester 700 and/or the system performance requirements. Changing the orientation and/or shape of the thermoelectric elements 710A and 710B may reduce the vertical space, while maximizing the surface area and thermal length of the thermoelectric element 710A and 710B.

The space 790 between the thermoelectric elements 710A and 710B and the second thermal conductor 730 may be unfilled (e.g., provided with a vacuum). In one embodiment, the space 790 between the thermoelectric elements 710A and 710B and the capping substrate 740 may be filled with air or a gas. In another embodiment, the space 790 between the thermoelectric elements 710A and 710B and the capping substrate 740 may be filed with a dielectric or a polyimide.

The thermoelectric elements 710A and 710B may include connecting portions 710C on one or both ends of the thermoelectric elements 710A and 710B that connect to interconnects 750. The interconnects 750, which may be copper or gold, may be deposited on the surface of the substrate 730 and 740. In one embodiment (not shown), the thermoelectric elements 710A and 710B may be directly connected via the interconnects 750 and via the connecting portions 710C. Interconnects 750 may connect the thermoelectric elements 710A and 710B to adjacent thermoelectric elements 710A and 710B, and may further connect to a via and to a pad 780 (which may be used for bonding to external connections).

The capping substrate 740 may be provided with additional interconnects 750 for connecting and integrating the harvester 700. The wafer scale structure of the thermoelectric energy harvester 700 allows it to be integrated with other integrated circuit components (not shown) formed as part of or near the thermoelectric energy harvester 700.

Dummy structures 770 formed on thermoplastic 720A, may be provided around the thermoelectric elements 710A, 710B, to form a seal around the thermoelectric elements 710A, 710B in the horizontal direction. A vacuum or a low pressure may be maintained between the thermoelectric elements and/or within the seal. The dummy structures 770 and 720A may be in the form of a ring, and may be formed using some of the same steps in the fabrication processes used to form the active thermoelectric elements 710A, 710B. The seal may be also used to prevent contaminants from entering into the active thermoelectric elements 710A, 710B during manufacturing process. Additionally, the dummy structures 770 and 720A may minimize thermal conduction, and thus decrease thermal energy loss in the horizontal direction.

The dummy structures 770 may be formed from n-type thermoelectric material, or p-type thermoelectric material on thermoplastic 720A but may be made inactive by disconnecting the dummy structures 770. In doing so, the dummy structures 770 and 720A may be formed as part of the manufacturing process using the same steps for forming the thermoelectric elements 710A and 710B, without the need for additional steps.

Without the seal of the dummy structures 770 and 720A, contaminants and particles may be introduced between the thermoelectric elements 710A and 710B during a polishing step. Thus, the dummy structures 770 and 720A aid in forming the vacuum or low pressure as well as prevent contamination during the manufacturing processes.

FIG. 7B illustrates a different version of harvester 700. Interconnects 750 may connect directly to a pad 780 (without using any additional metal layers and interconnects). This further reduces the number of steps in the manufacturing process. Here the dummy structures 770 are further reduced in horizontal area, so that they are electrically isolated from metal interconnects on the bottom side of the thermoplastic 720A.

FIG. 7C illustrates a general top-down view of the harvester 700 with a ring seal of dummy structure 770 around the thermoelectric elements 710A and 710B. The dummy structures 770 (not shown) are formed on the ring of thermoplastics 720A, forming a seal around the thermoelectric elements 710A and 710B. The thermoelectric elements 710A and 710B are formed on the thermoplastics 720, which are, for example, illustrated as "islands" inside the ring. Here, the thermoplastics "islands" 720 are illustrated as separate from the thermoplastic ring 720A. However, the thermoplastics 720 and 720A may be physically connected in a grid configuration.

Figure 8:
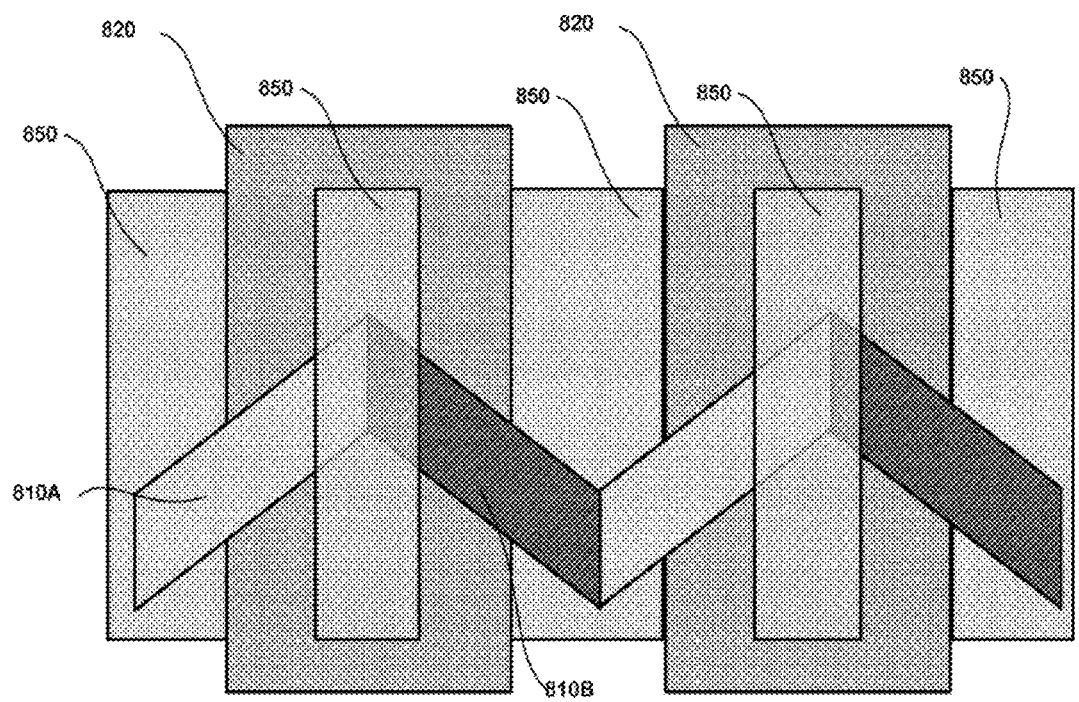
FIG. 8 illustrates exemplary configurations of a thermoelectric energy harvester according to embodiments of the present invention.

FIG. 8 illustrates exemplary configurations of a thermoelectric energy harvester 800 according to another embodiment of the present invention.

The thermoelectric energy harvester 800 may include a plurality of thermoelectric elements 810A, 810B, formed on thermoplastic islands 820 (similar to thermoplastics 720 in FIGS. 7A-7C), and electrically connected by metal interconnects 850. The thermoelectric elements 810A, 810B may include alternating elements of different types of thermoelectric material (e.g., p-type and n-type). The thermoelectric elements 810A, 810B may be interconnected electrically such that each thermoelectric element contributes to the overall energy provided by the thermoelectric energy harvester 800 in response to a temperature gradient between a first side (e.g., hot side) and a second side (e.g., cold side).

As shown in FIG. 8, the thermoelectric elements 810A, 810B may have a run length that is at least the height of the thermoelectric elements 810A, 810B. In one embodiment, the thermoelectric elements 810A, 810B may be slanted or sloped in both the horizontal and vertical direction. The slanted thermoelectric elements 810A, 810B may have a rectangular or cylindrical shape. In another embodiment, the thermoelectric elements 810A, 810B may have a conical shape or a pyramid shape. In one embodiment, within each row of the thermoelectric elements, the thermoelectric elements 810A may be slanted in one direction and the thermoelectric elements 810B may be slanted in an opposite direction (both horizontally and vertically), with a zig-zag pattern.

The various shapes of the thermoelectric elements 810A, 810B allow for the thermoelectric energy harvester 800 to have a semi-vertical or quasi-lateral structure. These shapes of the thermoelectric elements 810A, 810B may allow for the thickness of the thermoelectric energy harvester 800 to be reduced as compared to the vertical thermoelectric elements shown in FIG. 1A. The shapes and the depth of the thermoelectric elements 810A, 810B may be selected to maximize the surface area of the thermoelectric elements while keeping the thickness of the thermoelectric energy harvester 800 fixed.

Thus, the thermoelectric elements 810A and 810B may be horizontally sloped and vertically sloped, i.e. sloped in two dimensions relative to the direction of thermal gradient across the integrated circuit, in order to maximize the thermal length (length of thermal energy flow) through each active thermoelectric element, given the same overall size of the harvester 800.

Figure 9A:
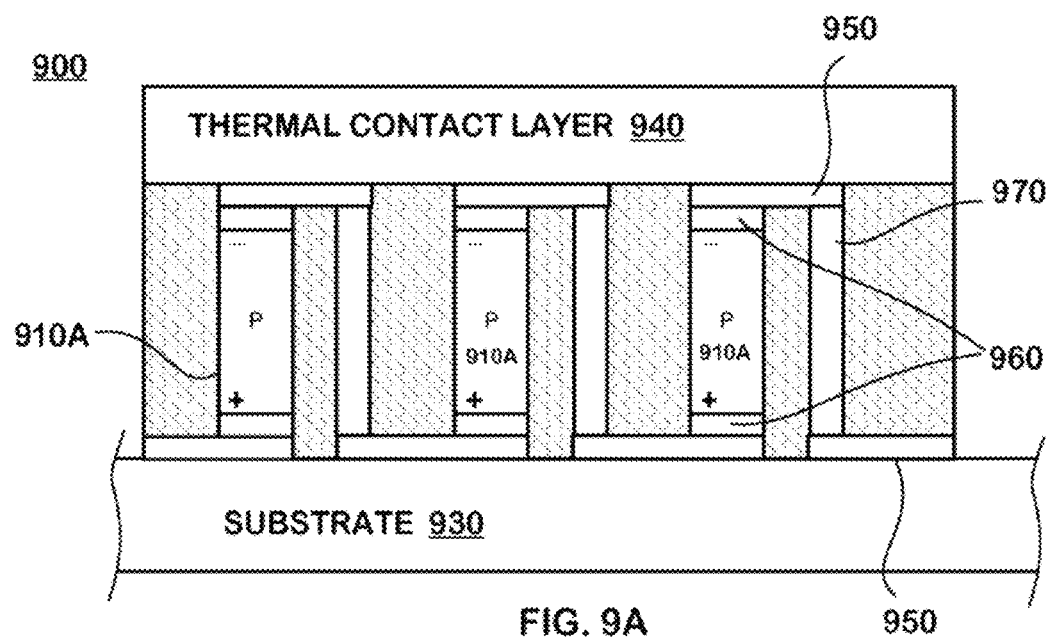
FIGS. 9A-9B illustrate exemplary configurations of a thermoelectric energy harvester according to another embodiment of the present invention.

FIG. 9A illustrates an exemplary configuration of a thermoelectric energy harvester 900 according to an embodiment of the present invention. The thermoelectric energy harvester 900 may include a plurality of thermoelectric elements 910A above a substrate layer 930. The thermoelectric elements 910A within a series may include elements of the same type of thermoelectric material (e.g., only p-type or only n-type). The thermoelectric elements 910A may be interconnected such that each thermoelectric element contributes to the overall energy provided by the thermoelectric energy harvester 900 in response to a temperature gradient between a first side (e.g., hot side) and a second side (e.g., cold side). A thermal contact layer 940 may be provided to support the temperature gradients between the first side and the second side. The thermal contact layer 940 may be made of a material that is a good heat conductor or may have a layer of good heat conductor.

As shown in FIG. 9A, the thermoelectric energy harvester 900 may include a vertical structure and may be formed as a single wafer. The wafer scale structure of the thermoelectric energy harvester 900 allows it to be integrated with other integrated circuit components (not shown in FIG. 9A) on or near the substrate 930.

As indicated, the thermoelectric elements 910A within a series may include elements of the same type of thermoelectric material (e.g., only p-type or only n-type). The thermoelectric material of the thermoelectric elements 910A may be selected to generate a flow of charge carriers of different polarity from one end of the thermoelectric element to an opposite end, in response to a temperature difference between the two ends. In a thermoelectric element 910A including p-type material, the positive charge carriers flow from a hot end to an opposite cold end.

The plurality of the thermoelectric elements 910A may be connected in an array by connecting the opposite polarity ends of the adjacent thermoelectric elements 910A, i.e., the top end of one thermoelectric element 910A connected to the bottom end of an adjacent thermoelectric element 910A. In this manner, the voltages and/or currents that are developed across the thermoelectric elements 910A may be summed together to generate a larger aggregate voltage and/or current than the thermoelectric elements 910A do individually. Outputs of the arrays of the thermoelectric elements 910A may be connected in parallel to provide the energy required in a particular application. Interconnects 950 and 970 may connect the thermoelectric elements 910A to adjacent thermoelectric elements 910A. Each series may include only the same type of thermoelectric material (e.g., only p-type or only n-type). However, different series of different types of thermoelectric material (e.g., p-type series and n-type series) may be integrated together.

While each thermoelectric element 910A may provide a small amount of energy (e.g., millivolts), connecting the thermoelectric elements 910A in an array may provide the higher energy needed for a particular application. When heat is applied to one side of the thermoelectric energy harvester 900, electrons in the thermoelectric elements 910A having p-type material will flow from the cold side to the hot side of the thermoelectric elements 910A. The energy generated in each of the thermoelectric elements 910A is combined and provided at the output terminals of the thermoelectric energy harvester 900.

Figure 9B:
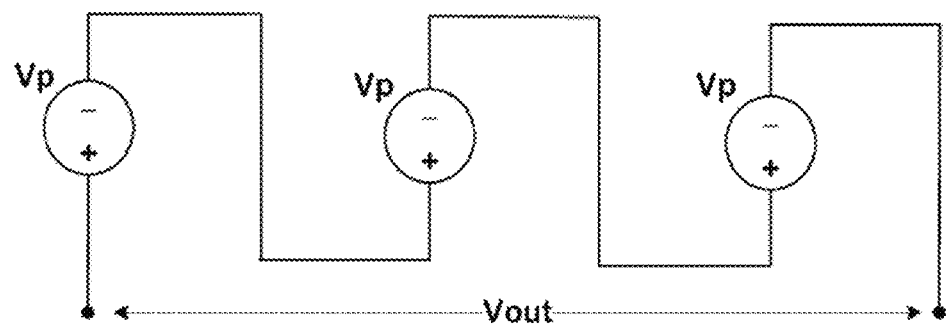

FIG. 9B illustrates a circuit equivalent of the thermoelectric energy harvester 900 shown in FIG. 9A. The voltages that are developed across the thermoelectric elements 910A are represented by Vp (for p-type thermoelectric elements 910A). The individual voltages and/or currents may be summed together to provide and aggregate output voltage Vout, and in the case drawn, the voltage is summed to get a useful voltage that can power a typical low power electronic circuit.

FIG. 9A is not drawn to scale but describes coarse dimensions of a harvester 900 in one embodiment. The thermoelectric elements 910A may have various different sizes and shapes.

Thermoelectric elements 910A can be purely p-type BixSb2-xTe3 or can be purely n-type Bi2Te3-xSex. The thermal contact layer 940 can be any electrically insulating but thermally conductive layer. In one embodiment, the thermal contact layer 940 can be made of multiple layers. For example, the thermal contact layer 940 may include a thin non-conductive layer such as oxide or nitride and one or more thicker metal layers on top to enhance thermal conduction. The thermal contact layer 940 may provide insulation at the interface to electric interconnection layer 950 to prevent electric short of electric interconnection layers 950. The substrate 930 can be any semiconducting substrate with enough thickness to promote thermal conduction at the bottom side. While the configuration of the substrate 930 as cold side and the top thermal contact layer 940 as the hot side is shown, the device can also function with the substrate 930 as the hot side and top thermal contact layer 940 as the cold side.

The interconnects 950 may be included on a hot side and on a cold side of the thermoelectric elements to connect adjacent thermoelectric elements. The thermoelectric elements may include a first interconnect on a hot side coupled to a first thermoelectric element and a second interconnect on a cold side coupled to a second thermoelectric element. The interconnects 950 at the first and last thermoelectric elements 910A may be output terminals to connect to other circuit components (e.g., external circuits, load or an energy storage device). The interconnects 950 and 970 may include a semiconductor material or a metallic connector (e.g., gold, copper or aluminum) or even organic electrical conductors. The interconnects 970 may be a metallic via.

Barrier metals 960 may be included between the thermoelectric elements 910A and the interconnects 950 to isolate the semiconductor materials of the thermoelectric elements 910A from the metal interconnects 950, while maintaining an electrical connection between the thermoelectric elements 910A and the interconnects 950. The barrier metals 960 may be included to prevent diffusion of the interconnects 950 into the semiconductor materials of the thermoelectric elements 910A.

Figure 10A:
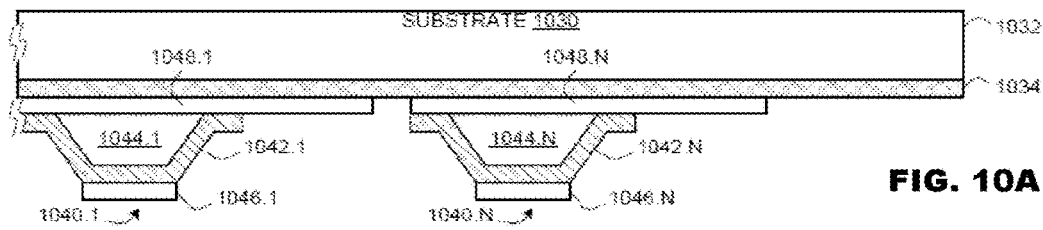
FIGS. 10A-10E illustrate exemplary configurations of a thermoelectric energy harvester according to another embodiment of the present invention.
Figure 10A:
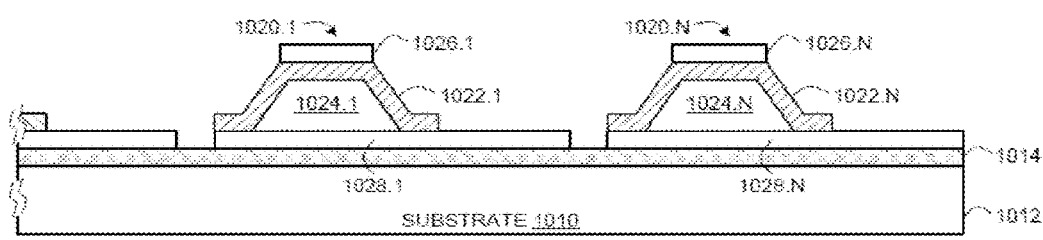
Figure 10B:
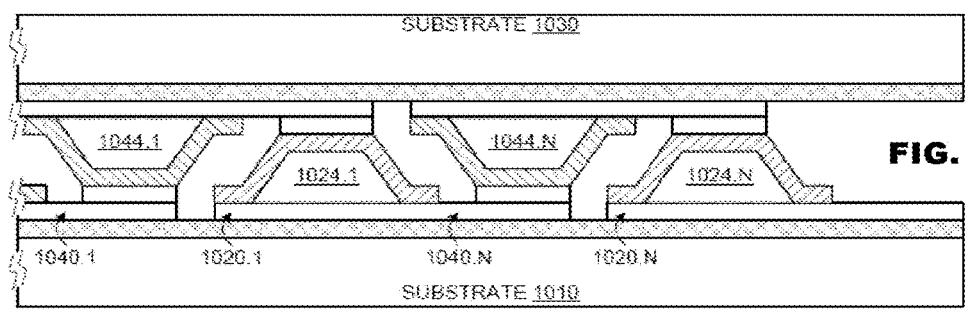

FIGS. 10A-10B illustrate a thermoelectric energy harvester 1000 according to another embodiment of the present invention. The harvester 1000 may include a first substrate 1010 with a first set of thermoelectric legs 1020.1-1020.N formed thereon and a second substrate 1030 with a second set of thermoelectric legs 1040.1-1040.N. The first and second set of thermoelectric legs 1020.1-1020.N, 1040.1-1040.N may be spaced apart so that, when they are joined together, thermoelectric legs 1020.1-1020.N from the first substrate 1010 fit within negative spaces formed between thermoelectric legs 1040.1-1040.N of the second substrate 1030 and thermoelectric legs 1040.1-1040.N of the second substrate 1030 fit within negative spaces formed between thermoelectric legs 1020.1-1020.N from the first substrate 1010. FIG. 10A illustrates the substrates 1010, 1030 separately and FIG. 10B illustrates orientation of the thermoelectric legs 1020.1-1020.N, 1040.1-1040.N when they are joined together.

The thermoelectric legs 1020.1-1020.N, 1040.1-1040.N may have a common architecture. In the example illustrated in FIGS. 10A-10B, each thermoelectric leg (say, 1020.1) is illustrated as having a pyramidal design having a single thermoelectric element 1022.1 of a thermoelectric material provided over a support structure 1024.1 of low thermal conductivity. A conductor 1026.1 may be provided at the "top" of the thermoelectric leg 1020.1 where it will be mounted to a conductor 1048.1 of a counterpart thermoelectric leg 1040.1 (in the case of leg 1020.1) from the opposing substrate 1030. The thermoelectric legs 1020.1 may include a conductor 1028.1 that connects to the thermoelectric elements 1022.1 at their bases at one end and form a mounting pad at another end for connection with a thermoelectric leg 1040.1 from the opposing substrate 1030.

The thermoelectric legs 1020.1-1020.N of one substrate 1010 may be made of a first type of thermoelectric material, for example, p-type BixSb2-xTe3 and the thermoelectric legs 1040.1-1040.N of the other substrate 1030 may be formed of a second type of thermoelectric material, for example, n-type Bi2Te3-xSex. These materials may generate opposing voltages and current flows in response to a common thermal gradient. The thermoelectric legs 1020.1-1020.N, 1040.1-1040.N may be connected in cascade by conductors to aggregate the voltages and current flows generated by the thermoelectric legs 1020.1-1020.N, 1040.1-1040.N as illustrated in FIG. 1B. Conductors at terminal ends of the chain may terminate in bonding pads (not shown) or other structures to permit connectivity to other circuit systems.

The embodiment of FIGS. 10A-10B provides another design in which the thermoelectric elements 1022.1-1022.N, 1042.1-1042.N have slanted profiles, which increases their lengths as compared to the columnar designs of FIGS. 1-4 and, therefore, should increase the electrical output. Each thermoelectric leg 1020.1, 1020.N, 1040.1, 1040.N, however, may have a single thermoelectric element manufactured of a single thermoelectric material, which should lower the cost and complexity of manufacture and increase device yield when the thermoelectric harvester 1000 is manufactured, as compared to other designs in which individual thermoelectric legs have a pair of thermoelectric elements of different types (e.g., FIG. 5). In the embodiment of FIGS. 10A-10B, because each thermoelectric leg 1020.1, 1020.N, 1040.1, 1040.N has a single thermoelectric element, the energy harvester 1000 is expected to have lower voltage output than similar designs (say, FIG. 5) having two thermoelectric elements 510A, 510B per leg. In the embodiment of FIGS. 10A-10B, however, the thermoelectric elements 1022.1, 1022.N, 1042.1, 1042.N have a correspondingly higher amount of thermoelectric material, which leads to higher output current than the embodiment of FIG. 5. Accordingly, the embodiment of FIGS. 10A-10B allows circuit designers to tailor configuration of their thermoelectric harvesters to fit their individual design needs (output voltage versus output current).

As in the other embodiments, the substrate 1010 may be a structure that provides good thermal conductivity but is electrically isolated from the thermoelectric elements 1022.1, 1022.N, 1042.1, 1042.N and conductors 1028.1, 1028.N, 1048.1, 1048.N of the harvester 1000. For example, the substrate 1010 may be manufactured as a multi-layer device in which a base substrate 1012 is a simple thermal conductor (for example, silicon) over which an electrical insulator layer 1014, such as silicon dioxide, is formed.

Similarly, the capping substrate 1030 also may be a structure that provides good thermal conductivity but is electrically isolated from the thermoelectric elements 1022.1, 1022.N, 1042.1, 1042.N and conductors 1028.1, 1028.N, 1048.1, 1048.N of the harvester 1000. Here again, the capping substrate 1030 may be manufactured as a multi-layer device in which a base substrate 1032 is a simple thermal conductor (for example, a metal) over which an electrical insulator layer 1034, such as silicon dioxide, is formed.

Figure 10C:
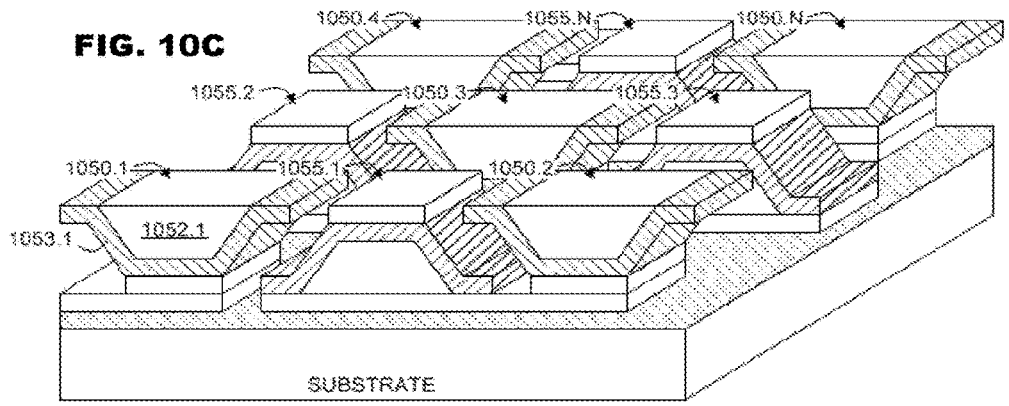
Figure 10D:
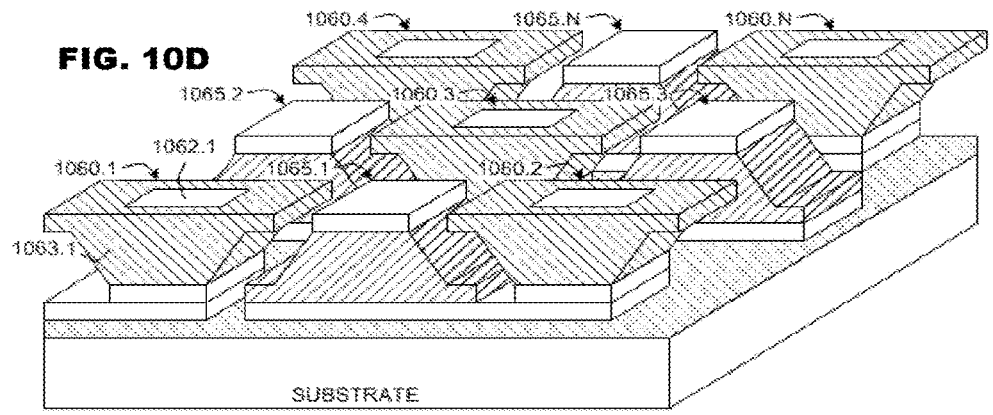

The principles of the foregoing embodiments find application with thermoelectric legs in a variety of configurations. FIG. 10C, for example, is a perspective view illustrating thermoelectric legs 1050.1-1050.N, 1055.1-1055.N in which thermoelectric material is provided on two sides of the legs 1050.1-1050.N, 1055.1-1055.N. In this configuration, supports 1052.1 may be formed as islands (e.g., separate from each other) and thermoelectric material 1053.1 may be deposited on various sides of the supports 1052.1. FIG. 10D illustrates a configuration for thermoelectric legs 1060.1-1060.N, 1065.1-1065.N in which thermoelectric material 1063.1 is provided on four sides of their respective pyramidal supports 1062.1.

Figure 10E:
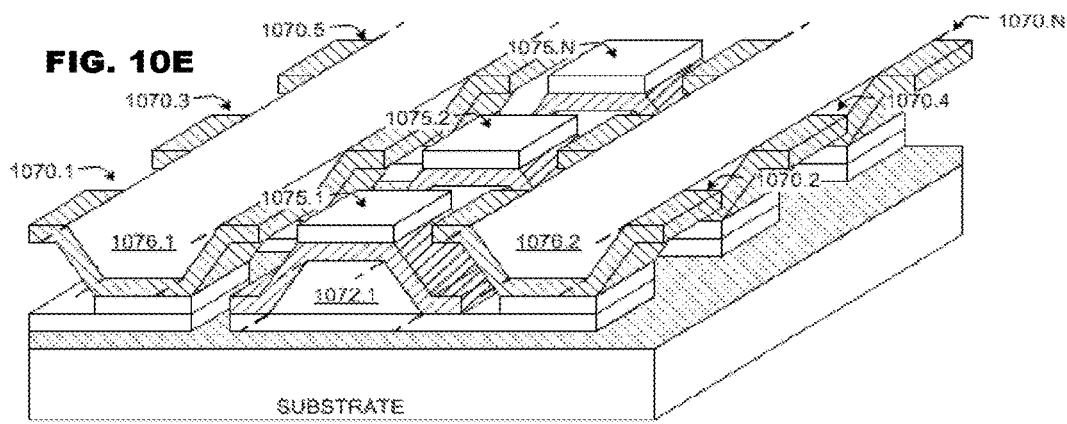

Alternatively, as shown in FIG. 10E, thermoelectric legs 1070.1-1070.N, 1075.1-1075.N may be formed on continuous supports 1072.1, 1076.1, 1076.2. In this configuration, a plurality of thermoelectric legs (say, 1075.1, 1075.2, 1075.N) may be formed on a single support 1072.1. The support 1072.1 may have a trapezoidal cross-section and a depth sufficient to accommodate deposition of the thermoelectric material of several of the thermoelectric legs 1075.1, 1075.2, 1075.N. Similarly, supports 1076.1, 1076.2 may have a trapezoidal cross-section and a depth sufficient to accommodate deposition of the thermoelectric material of several other thermoelectric legs (e.g., legs 1070.1, 1070.3, 1070.5 for support 1076.1 and legs 1070.2, 1070.4, 1070.N for support 1076.2).

Figure 11A:
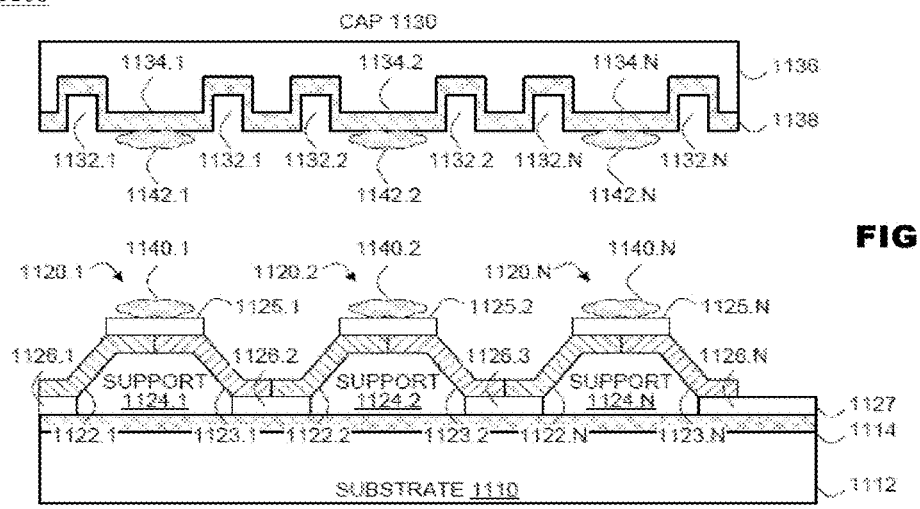
FIGS. 11A-11D illustrate exemplary configurations of a thermoelectric energy harvester according to another embodiment of the present invention.
Figure 11B:
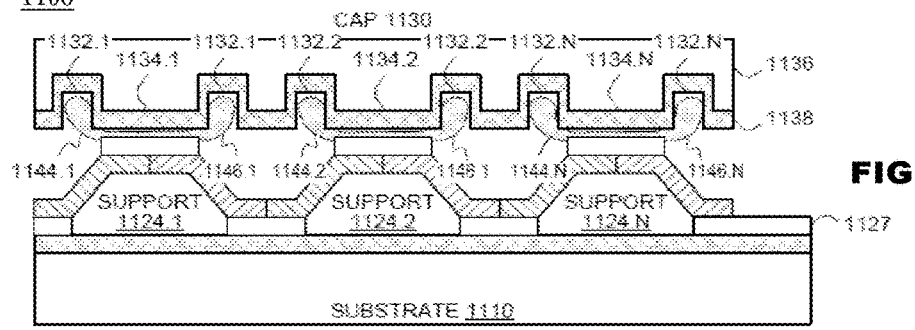

FIGS. 11A-11B illustrate a thermoelectric energy harvester 1100 according to another embodiment of the present invention. The harvester 1100 may include a first substrate 1110 with a plurality of thermoelectric legs 1120.1-1120.N formed thereon and a capping substrate 1130 with a plurality of trenches 1132.1-1132.N formed therein that circumscribe regions 1134.1-1134.N of the capping substrate 1130 to which the thermoelectric legs 1120.1-1120.N will be mounted.

The energy harvester 1100 may be constructed according to any of the embodiments described herein. In the example illustrated in FIGS. 11A-11B, each thermoelectric leg (say, 1120.1) is illustrated as having a pyramidal design having a pair of thermoelectric elements 1122.1, 1123.1 of alternating type provided over a support structure 1124.1 of low thermal conductivity. Again, the thermoelectric elements 1122.1, 1123.1 may be connected by a conductor 1125.1 at the "top" of the thermoelectric leg 1120.1 where it will be mounted to the capping substrate 1130. A thermoelectric element 1123.1 of one type of thermoelectric material may be connected to a complementary thermoelectric element 1122.2 of a neighboring thermoelectric leg 1120.2 by a conductor 1126.2. Thus, the thermoelectric elements 1122.1-1122.N and 1123.1-1123.N may be connected to form a serial chain of thermoelectric voltage sources as illustrated in FIG. 1B. Conductors at terminal ends of the chain, only one of which 1126.N is shown in FIGS. 11A-11B, may terminate in bonding pads 1127 or other structures to permit connectivity to other circuit systems (not shown).

As in the other embodiments, the substrate 1110 may be a structure that provides good thermal conductivity but is electrically isolated from the thermoelectric elements 1122.1-1122.N, 1123.1-1123.N of the harvester 1100. For example, the substrate 1110 may be manufactured as a multi-layer device in which a base substrate 1112 is a simple thermal conductor (for example, silicon) over which an electrical insulator layer 1114, such as silicon dioxide, is formed.

Similarly, the capping substrate 1130 also may be a structure that provides good thermal conductivity but is electrically isolated from the thermoelectric elements 1122.1-1122.N, 1123.1-1123.N of the harvester 1100. Here again, the capping substrate 1130 may be manufactured as a multi-layer device in which a base layer substrate 1136 is a simple thermal conductor (for example, a metal) over which an electrical insulator layer 1138, such as silicon dioxide, is formed. As indicated, a plurality of trenches 1132.1-1132.N may be formed in a surface of the capping substrate 1130 that circumscribe regions 1134.1-1134.N to which the thermoelectric legs 1120.1-1120.N will be mounted.

During manufacture, when the thermoelectric legs 1120.1-1120.N are joined to the capping substrate 1130, a eutectic material may be used to facilitate a bond between the thermoelectric legs 1120.1-1120.N and the capping substrate 1130. FIG. 11A illustrates depositions 1140.1-1140.N of a eutectic component material (say, tin Sn) provided atop the conductors 1125.1-1125.N of the thermoelectric legs 1120.1-1120.N and depositions 1142.1-1142.N of a second eutectic component (say, gold Au) provided on the mounting regions 1134.1-1134.N. The depositions 1140.1-1140.N, 1142.1-1142.N may form a eutectic material when the capping substrate 1130 is mounted to the thermoelectric legs 1120.1-1120.N. If eutectic material (say, 1140.1, 1140.2) from adjacent thermoelectric legs 1120.1 and 1120.2 were to contact each other, they would create an electrically-conductive path between them that would disable thermoelectric elements 1123.1 and 1122.2 from contributing to the electrical output of the harvester 1100. Essentially, the joining of different eutectic depositions 1140.1, 1140.2 would create a short circuit between the conductors 1125.1, 1125.2 of those thermoelectric legs 1120.1, 1120.2.

It is expected that, when the capping substrate 1130 is mounted to the thermoelectric legs 1120.1-1120.N, any eutectic material that flows laterally away from mounting locations 1134.1-1134.N where the thermoelectric legs 1120.1-1120.N contact the capping substrate 1130 will flow first into the trenches 1132.1-1132.N that circumscribe the mounting locations 1134.1-1134.N. This effect is illustrated in FIG. 11B where portions 1144.1-1144.N, 1146.1-1146.N of the eutectic material 1140.1-1140.N are shown filling the trenches 1132.1-1132.N in FIG. 11A.

The principles of the present disclosure accommodate eutectic flow regardless of how the eutectic material is created. For example, eutectic material may be deposited on one of the structures—either on the conductors 1125.1-1125.N of the thermoelectric legs 1120.1-1120.N or on the mounting regions 1134.1-1134.N of the capping substrate 1130. The eutectic material may be created before deposition rather than being deposited a component material. Moreover, a variety of eutectic materials may find application with the thermal harvester 1100 provided the eutectic is a thermal conductor. Such variations are immaterial to the present discussion unless noted herein.

Figure 11C:
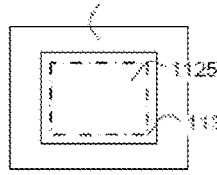
Figure 11C:
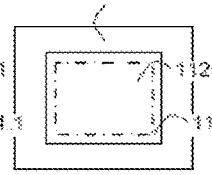

FIG. 11C illustrates a plan view of trenches for two thermoelectric legs according to an embodiment of the present disclosure. As illustrated, the trenches 1132.1, 1132.2 circumscribe mounting regions 1134.1, 1134.2 provided in the capping substrate 1130 to accommodate the thermoelectric legs (not shown) of the energy harvester. FIG. 11C illustrates in phantom a possible arrangement of the conductors 1125.1, 1125.2 from the thermoelectric legs and their relationship to the mounting regions 1134.1, 1134.2 and the trenches 1132.1, 1132.

The spatial configuration of the trenches may vary to accommodate different design needs. For example, although the trenches are illustrated in FIG. 11C as having a rectangular profile, the trenches may take other profiles—hexagonal, octagonal, and oval—as may be convenient. Moreover, the trenches need not have rectilinear grooves as shown in FIGS. 11A and 11B but, instead, may take other profiles—v-shaped grooves, half-pipe profiles—as may be convenient.

Figure 11D:
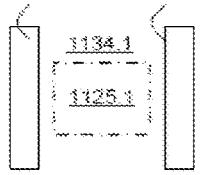
Figure 11D:
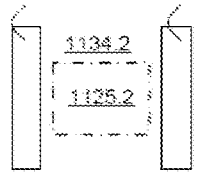

Further, as illustrated in FIG. 11D, the trenches need not fully circumscribe mounting regions 1134.1, 1134.2 in certain implementations. If, for example, the spacing between adjacent thermoelectric legs in one direction is sufficiently sparse to mitigate the risk that eutectic material from those legs will contact each other, then trenches need not be provided as barriers to eutectic flow in those directions but trenches may be provided as barriers to eutectic flow in another direction. Thus, FIG. 11D illustrates pairs of trenches 1132.1a, 1132.1b, 1132.2a, 1132.2b provided about mounting regions 1134.1, 1134.2 in a horizontal direction in the figure but no trenches are provided in the vertical direction. Such an implementation would be warranted where there is a sufficiently high risk of creating electrical shorts in the system due to eutectic flow between mounting regions 1134.1 and 1134.2 but there is less risk of creating electrical shorts due to eutectic flow in other directions (e.g., vertically in the drawing).

Additionally, in embodiments where trenches are provided that only partially circumscribe a mounting region, a wetting material (not shown) may be provided on the capping substrate 1130 on the mounting regions 1134.1, 1134.2 and their associated trenches 1132.1a, 1132.1b, 1132.2a, 1132.2b to facilitate flow of the eutectic material toward those trenches. The wetting material may reduce further any risk that flow of eutectic material will occur in a direction that is not impeded by a trench 1132.1a, 1132.1b, 1132.2a or 1132.2b.

The use of trenches to protect against electrical shorts that otherwise might occur due to inadvertent flow of eutectic material may be performed cooperatively with any of the harvester designs described herein, including, for example the columnar thermoelectric legs of FIGS. 1A and 2-5 and the thermoelectric legs of FIGS. 10A-10E. In these examples, trenches may be provided in one or more substrates where eutectic material facilitates a bond between conductive structures in the harvester and in which there is a risk the eutectic material may create unintended short circuits between conductive structures that should not be directly connected to each other. For example, in FIG. 1A, trenches may be provided between adjacent conductors 150 in the substrate 130 and/or the thermal contact layer 140. Similarly, in FIG. 10A, trenches may be provided between adjacent conductors 1028.1, 1028.N in substrate 1010 and/or between adjacent conductors 1048.1, 1048.N in substrate 1030. In each case, the trenches may guard against inadvertent short circuits between components of the thermoelectric energy harvesters 100, 1000 that should not be directly connected to each other.

Moreover, the use of trenches to protect against electrical shorts that otherwise might occur due to inadvertent flow of eutectic material may be performed cooperatively with the use of trenches as scribe lines/notches 690 (FIG. 6A) that facilitate manufacture of the thermoelectric harvester by wafer layer bonding. In an embodiment where a first set of trenches 1132.1-1132.N (FIGS. 11A-11D) are provided to capture eutectic material and other trenches are provided as scribe lines/notches 690 (FIG. 6A), the trenches 1132.1-1132.N for eutectic material capture may have a depth insufficient to reach a polishing line 695. Thus, when substrates are thinned, the scribe lines/notches 690 may provide guidance for dicing the bonded structure into individual thermoelectric harvester devices.

Although the invention has been described above with reference to specific embodiments, the invention is not limited to the above embodiments and the specific configurations shown in the drawings. For example, some components shown may be combined with each other as one embodiment, or a component may be divided into several subcomponents, or any other known or available component may be added. Those skilled in the art will appreciate that the invention may be implemented in other ways without departing from the spirit and substantive features of the invention. The present embodiments are therefore to be considered in all respects as illustrative and not restrictive. The scope of the invention is indicated by the appended claims rather than by the foregoing description, and all changes that come within the meaning and range of equivalency of the claims are therefore intended to be embraced therein.

What is claimed is:

1. A thermoelectric harvester, comprising:
   a first substrate having thereon a plurality of thermoelectric legs; and
   a second substrate having a plurality of mounting regions bonded with the plurality of thermoelectric legs by respective instances of a eutectic material, and a plurality of trenches in proximity to the plurality of mounting regions and configured to impede flow of adjacent instances of the eutectic material.

2. The thermoelectric harvester of claim 1, wherein the plurality of thermoelectric legs have columnar shapes.

3. The thermoelectric harvester of claim 1, wherein the plurality of thermoelectric legs have pyramidal shapes.

4. The thermoelectric harvester of claim 1, wherein a first thermoelectric leg of the plurality of thermoelectric legs is formed of a single thermoelectric material.

5. The thermoelectric harvester of claim 1, wherein a first thermoelectric leg of the plurality of thermoelectric legs is formed of a pair of thermoelectric materials of different types.

6. The thermoelectric harvester of claim 1, wherein a first trench of the plurality of trenches circumscribes a respective mounting region.

7. The thermoelectric harvester of claim 1, wherein a first trench of the plurality of trenches partially circumscribes a respective mounting region.

8. The thermoelectric harvester of claim 1, wherein the second substrate is formed of a thermal conductor having an electrical insulator layer overlaying the thermal conductor, and the plurality of mounting regions are on the electrical insulator layer.

9. The thermoelectric harvester of claim 1, wherein a first mounting region of the plurality of mounting regions has a wetting material thereon.

10. The thermoelectric harvester of claim 9, wherein a trench of the plurality of trenches nearest the first mounting region has the wetting material thereon.

11. The thermoelectric harvester of claim 1, wherein
the plurality of thermoelectric legs is a first plurality of thermoelectric legs, the plurality of mounting regions is a first plurality of mounting regions, and the plurality of trenches is a first plurality of trenches,
the second substrate has thereon a second plurality of thermoelectric legs; and
the first substrate has thereon a second plurality of mounting regions bonded with the second plurality of thermoelectric legs by respective instances of the eutectic material, and a second plurality of trenches formed in proximity to the second plurality of mounting regions and configured to impede flow of adjacent instances of the eutectic material.

12. A thermoelectric harvester, comprising:
a first substrate;
a plurality of thermoelectric elements on the first substrate; and
a second substrate having a plurality of mounting regions bonded with the plurality of thermoelectric elements by respective instances of a eutectic material, and a plurality of trenches in proximity to the plurality of mounting regions configured to impede flow of adjacent instances of the eutectic material.

13. The thermoelectric harvester of claim 12, wherein the plurality of thermoelectric elements have columnar shapes.

14. The thermoelectric harvester of claim 12, wherein the plurality of thermoelectric elements have pyramidal shapes.

15. The thermoelectric harvester of claim 12, wherein a first thermoelectric element of the plurality of thermoelectric elements is formed of a single thermoelectric material.

16. The thermoelectric harvester of claim 12, wherein a first thermoelectric element of the plurality of thermoelectric elements is formed of a pair of thermoelectric materials having complementary thermoelectric responses to a common thermal gradient.

17. A thermoelectric harvester, comprising:
a first substrate;
a second substrate having a plurality of mounting regions and a plurality of trenches in proximity to the mounting regions; and
a plurality of thermoelectric elements between the first and second substrates, each of the plurality of thermoelectric elements bonded with a respective mounting region by a respective instance of a eutectic material, wherein the plurality of trenches are positioned as barriers to flow of the eutectic material.

18. The thermoelectric harvester of claim 17, wherein a first trench of the plurality of the trenches circumscribes a respective mounting region.

19. The thermoelectric harvester of claim 17, wherein a first trench of the plurality of trenches partially circumscribes a respective mounting region.

20. The thermoelectric harvester of claim 17, wherein each mounting region is adjacent to at least one of the plurality of trenches.

21. The thermoelectric harvester of claim 17, wherein the plurality of thermoelectric elements have slanted profiles.

* * * * *